United States Patent [19]
Watanabe et al.

[11] Patent Number: 5,889,304
[45] Date of Patent: Mar. 30, 1999

[54] NONVOLATILE SEMICONDUCTOR MEMORY DEVICE

[75] Inventors: Hiroshi Watanabe; Kazuhiro Shimizu, both of Yokohama; Yuji Takeuchi, Kawasaki; Seiichi Aritome, Yokohama, all of Japan

[73] Assignee: Kabushiki Kaisha Toshiba, Kawasaki, Japan

[21] Appl. No.: 884,555

[22] Filed: Jun. 27, 1997

[30] Foreign Application Priority Data

Jun. 28, 1996 [JP] Japan .................................. 8-170411

[51] Int. Cl.$^6$ .................................................. H01L 29/788
[52] U.S. Cl. ........................ 257/321; 257/315; 257/317; 365/185.11
[58] Field of Search ................................... 257/315, 317, 257/321; 365/185.11

[56] References Cited

U.S. PATENT DOCUMENTS 5,455,790  10/1995  Hart et al. ......................... 365/185.11

FOREIGN PATENT DOCUMENTS

| 59-155172 | 9/1984 | Japan . |
| 8-078542 | 3/1996 | Japan . |
| 8-88285 | 4/1996 | Japan . |

*Primary Examiner*—Valencia Martin-Wallace
*Attorney, Agent, or Firm*—Banner & Witcoff, Ltd.

[57] ABSTRACT

Disclosed is the memory cell of an EEPROM having a p-type silicon substrate and a floating gate formed on this silicon substrate via a tunnel oxide film. The element region set in the silicon substrate projects from the surface of a trench-type element isolation region. The projecting element region has a curved portion for increasing the density of tunnel electric current, and is rounded to concentrate the tunnel electric current as far as no breakdown occurs in the tunnel oxide film.

20 Claims, 25 Drawing Sheets

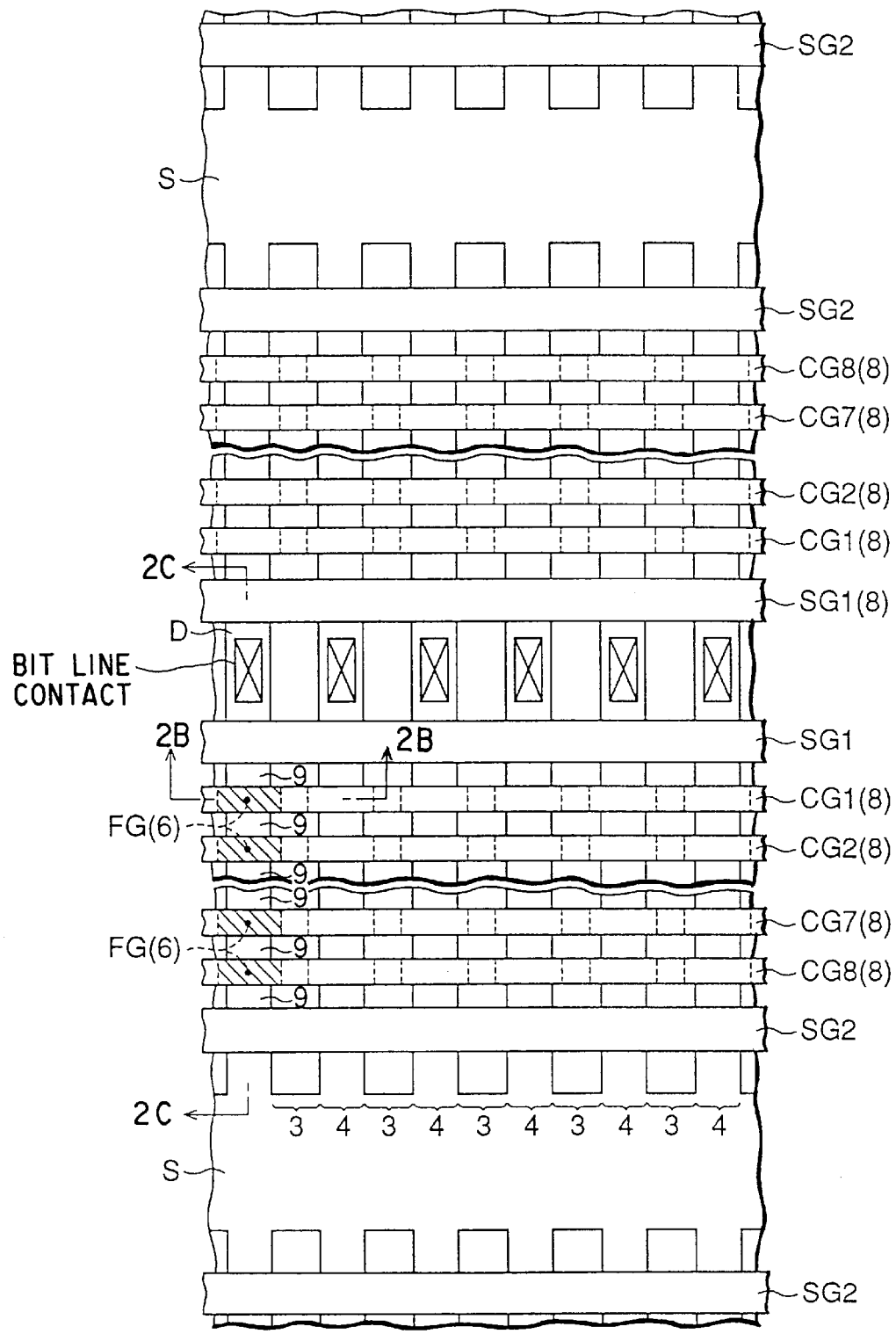
F I G. 2A

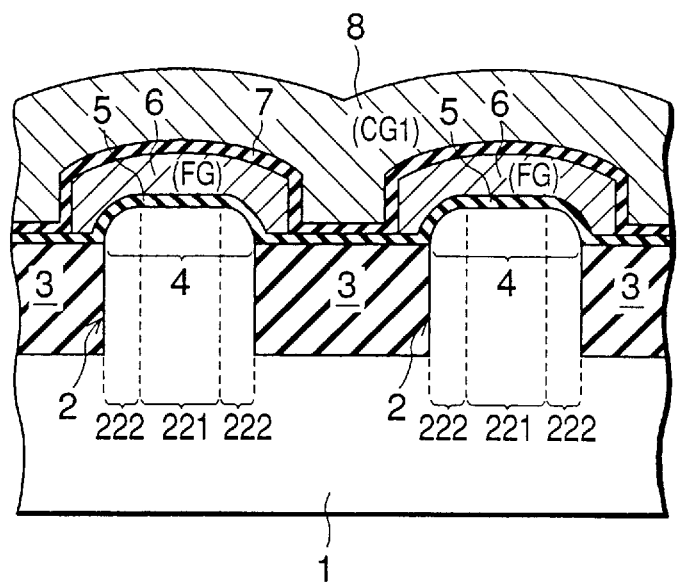
F I G. 2B
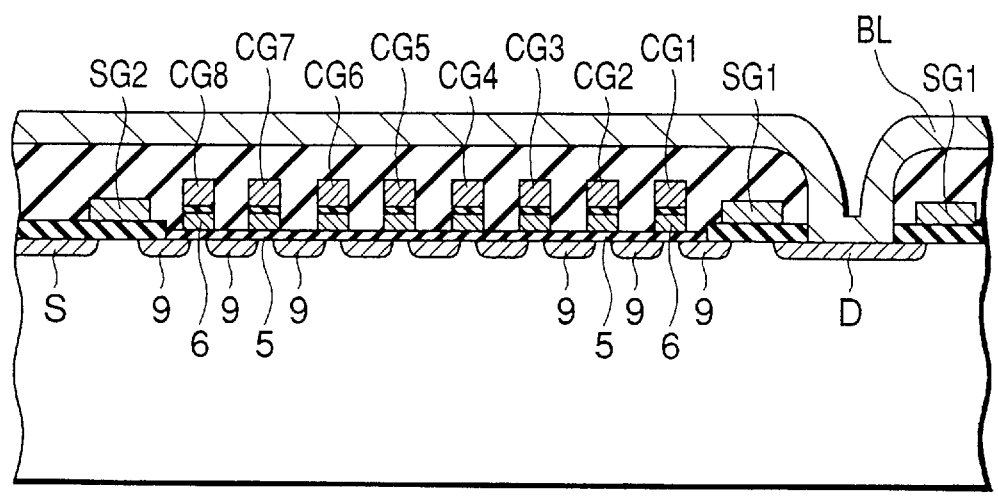
F I G. 2C

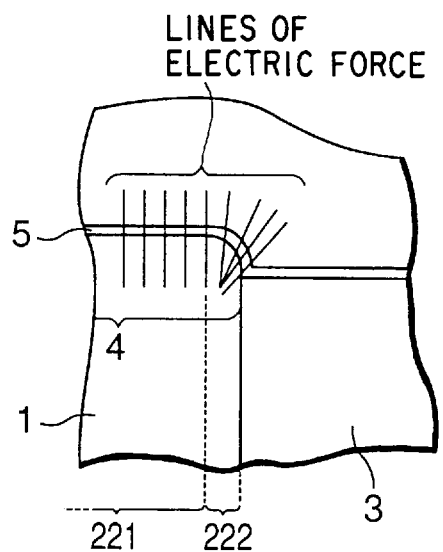
F I G. 3
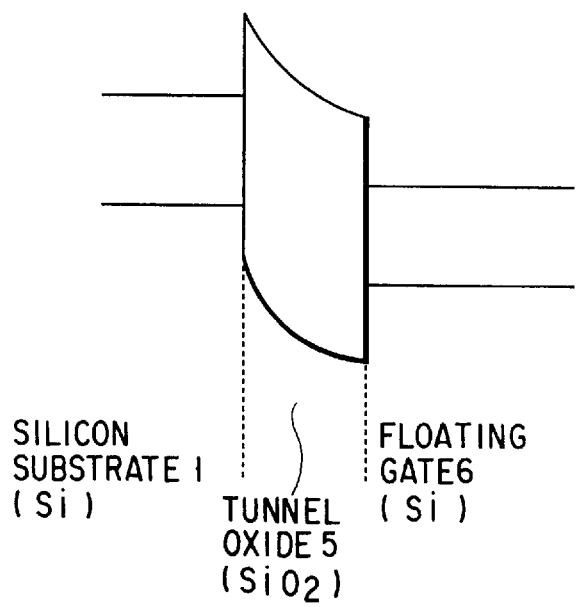
F I G. 4

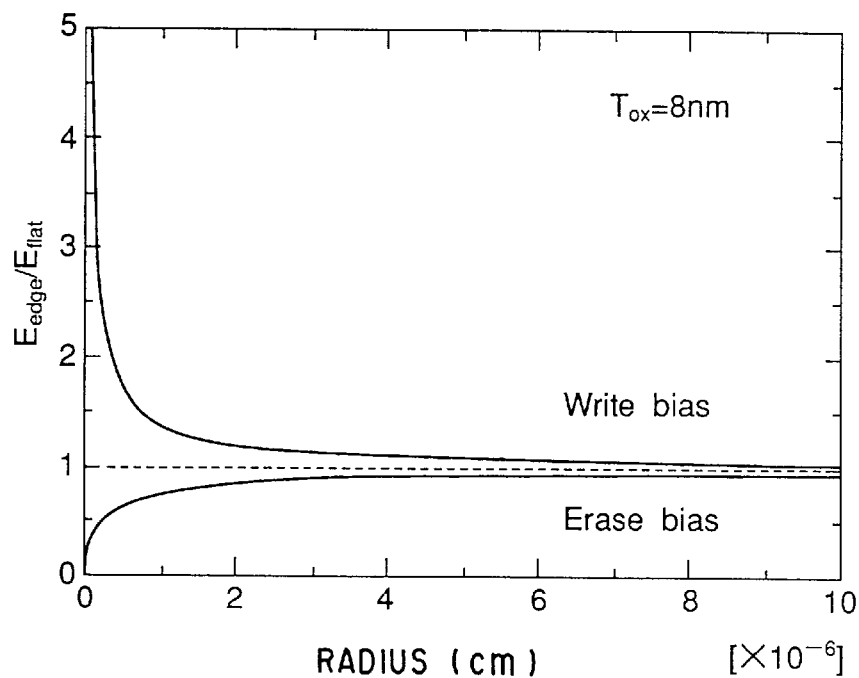
F I G. 5
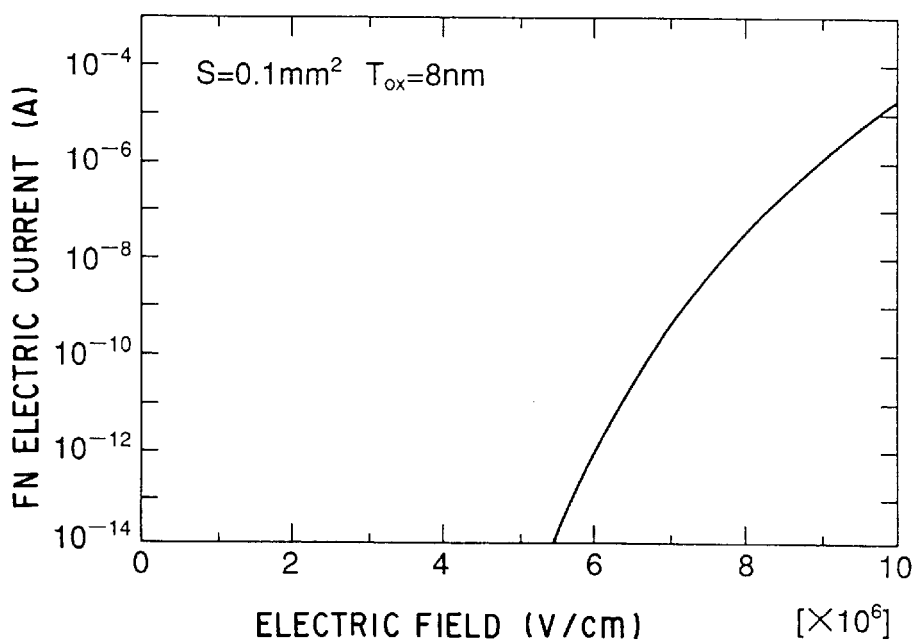
F I G. 6

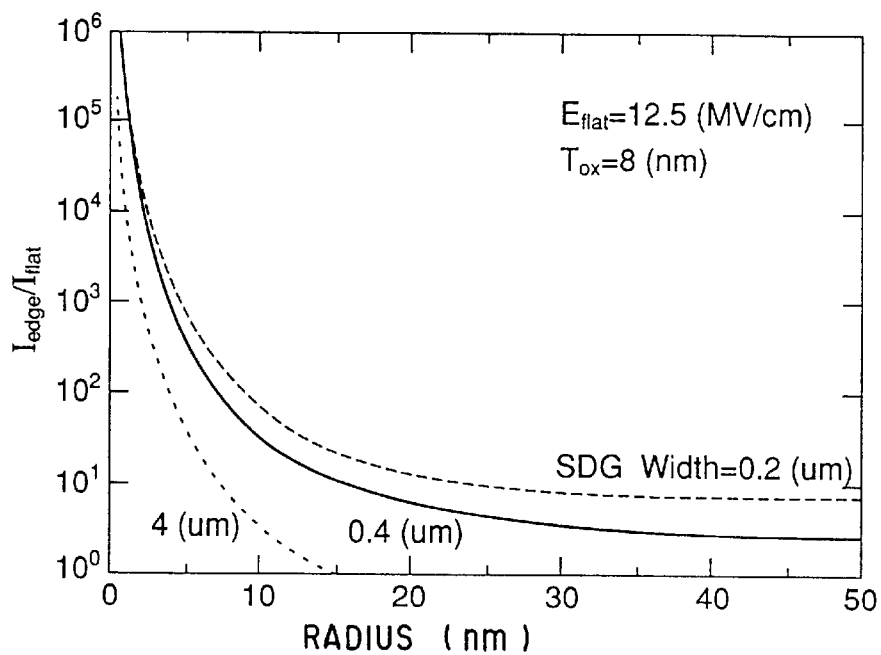
F I G. 7
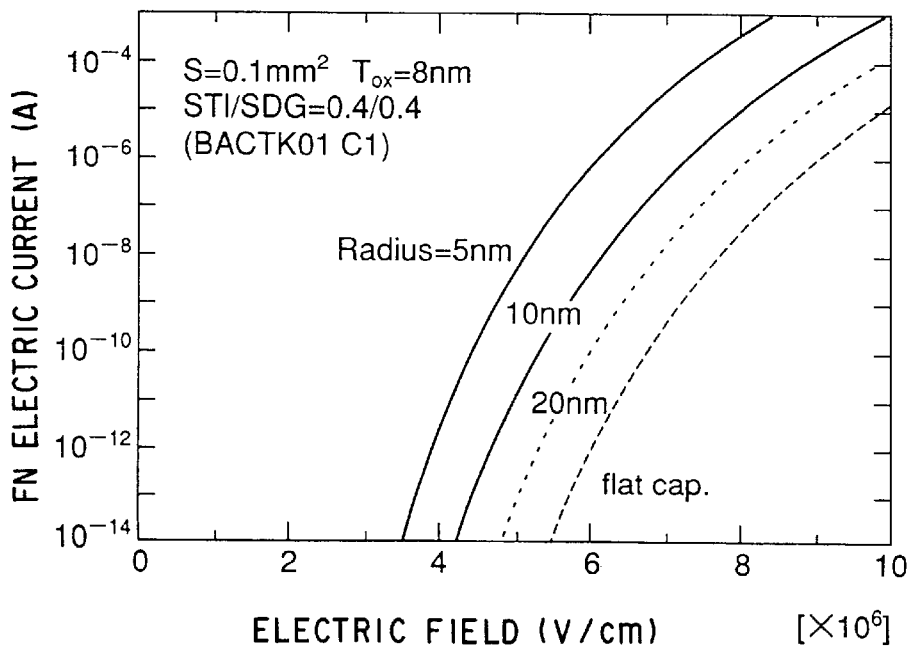
F I G. 8

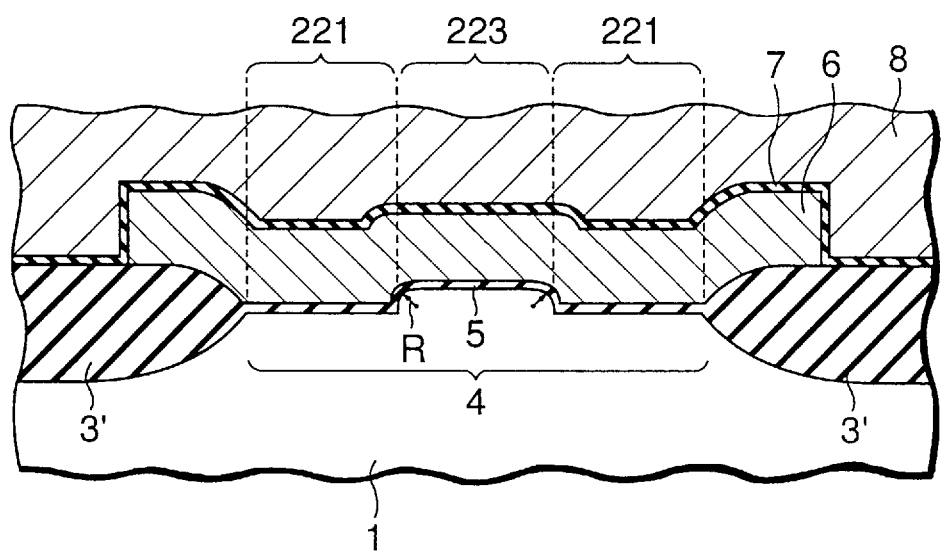
F I G. 16

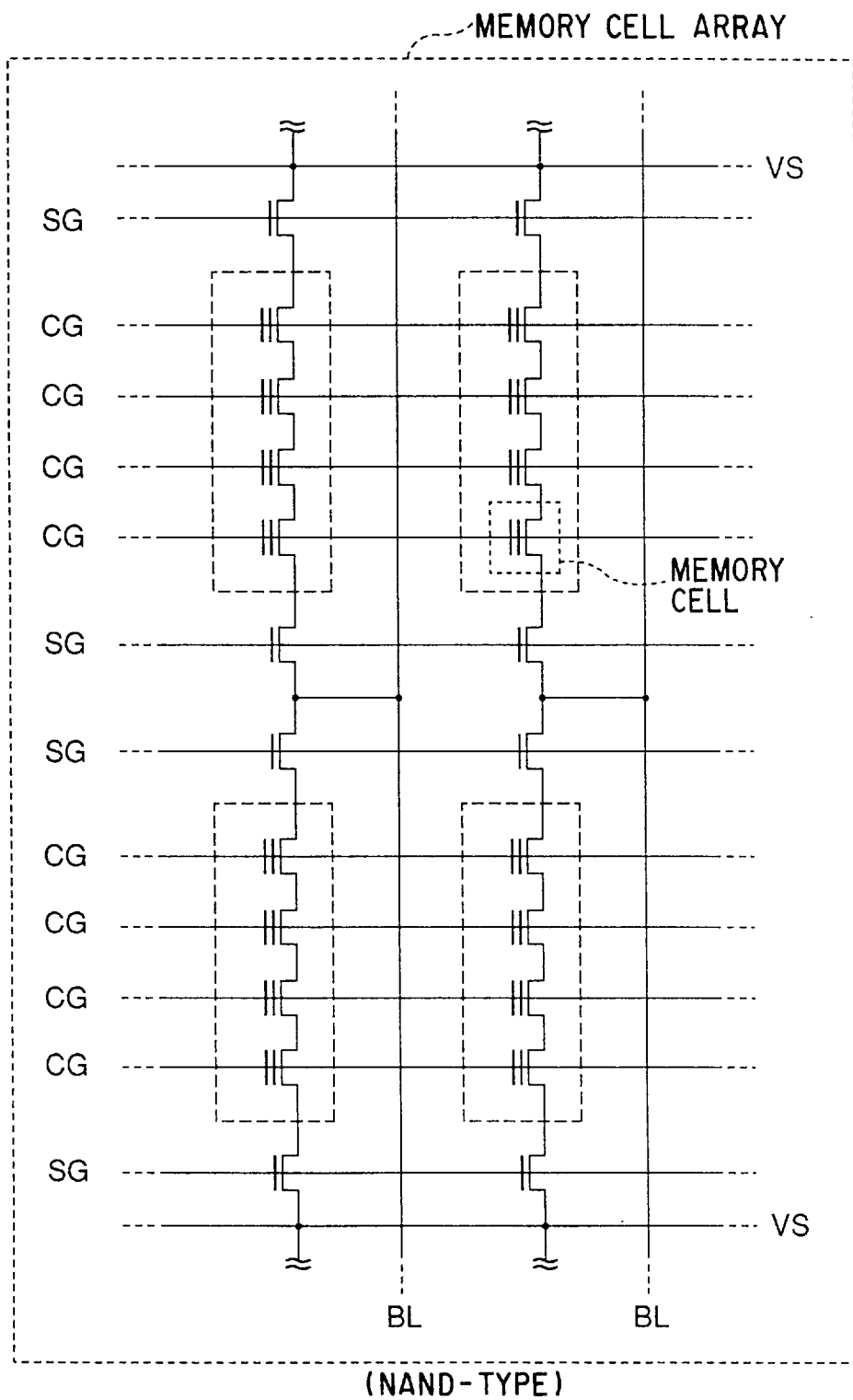
F I G. 17

(NOR-TYPE)

(NOR-TYPE)

(GROUND ARRAY-TYPE : NOR-TYPE)

(ALTERNATE GROUND ARRAY-TYPE : NOR-TYPE)

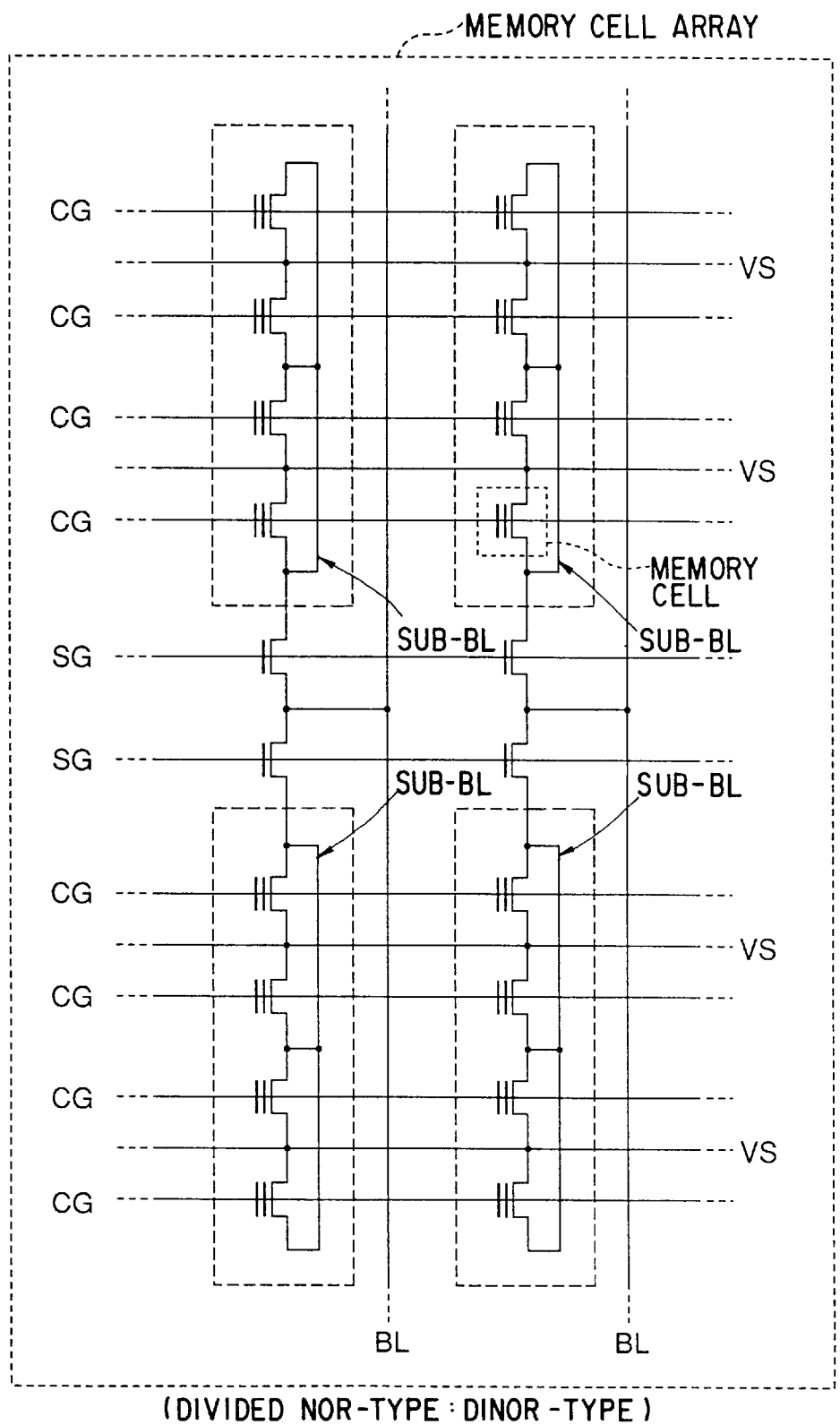
(DIVIDED NOR-TYPE : DINOR-TYPE)
F I G. 22

FIG. 23 (AND-TYPE)

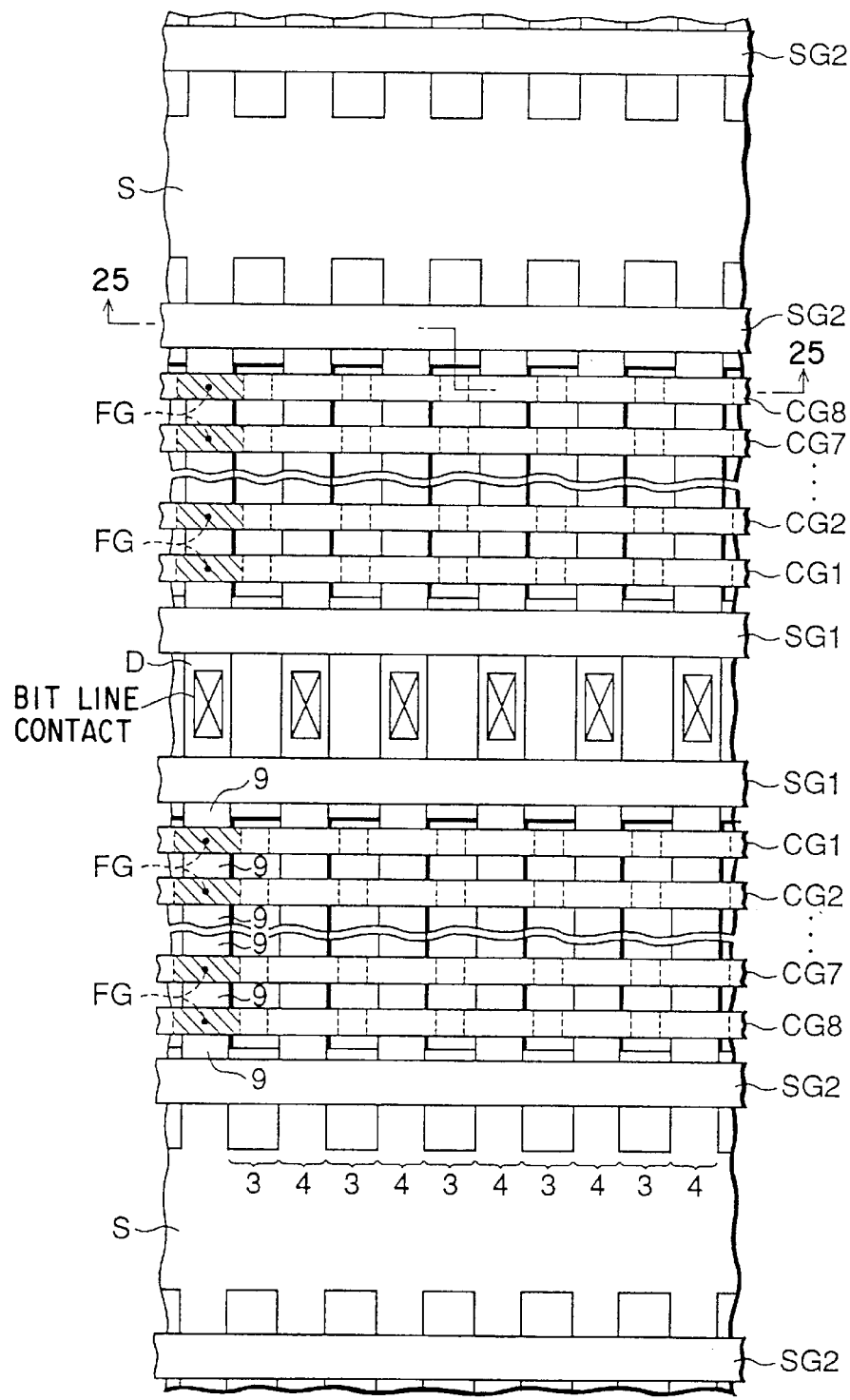
F I G. 24

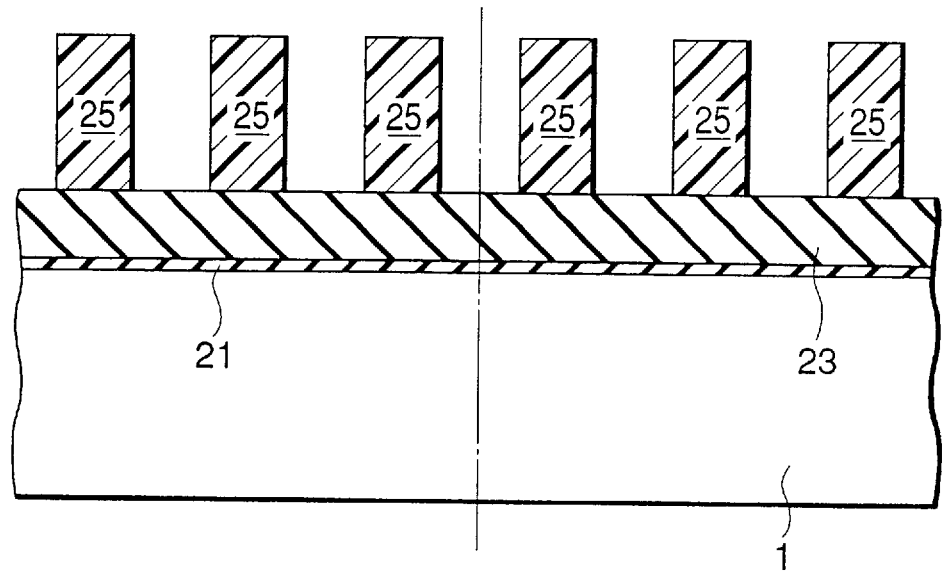
F I G. 25A
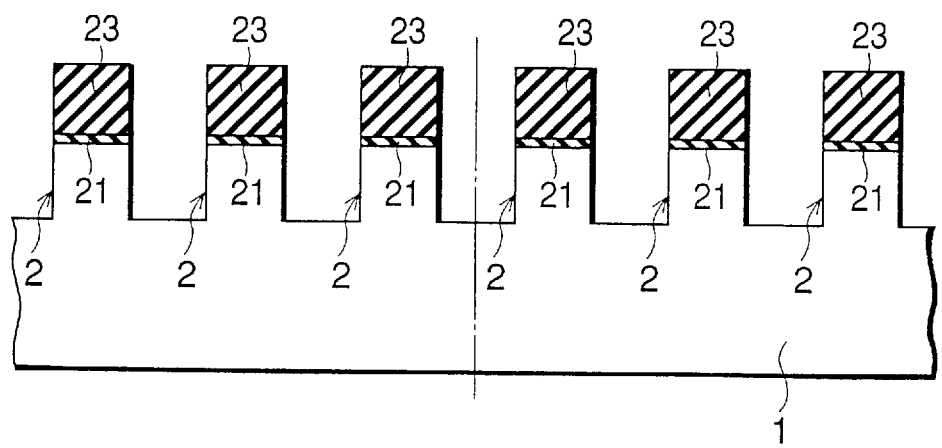
F I G. 25B

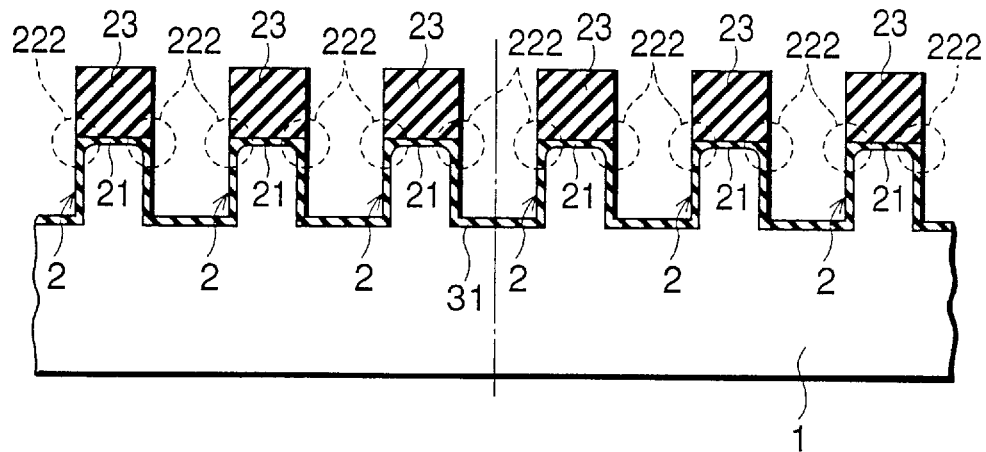
F I G. 25C
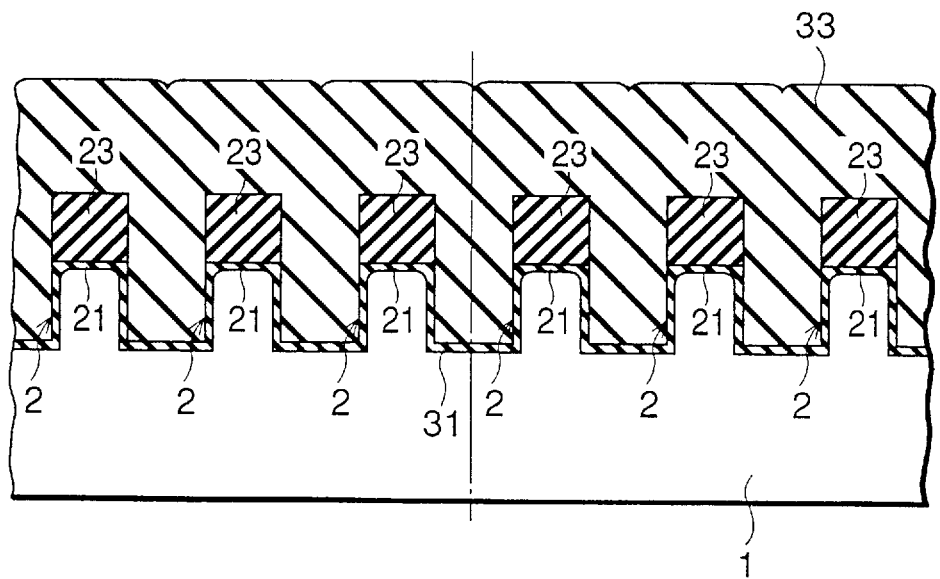
F I G. 25D

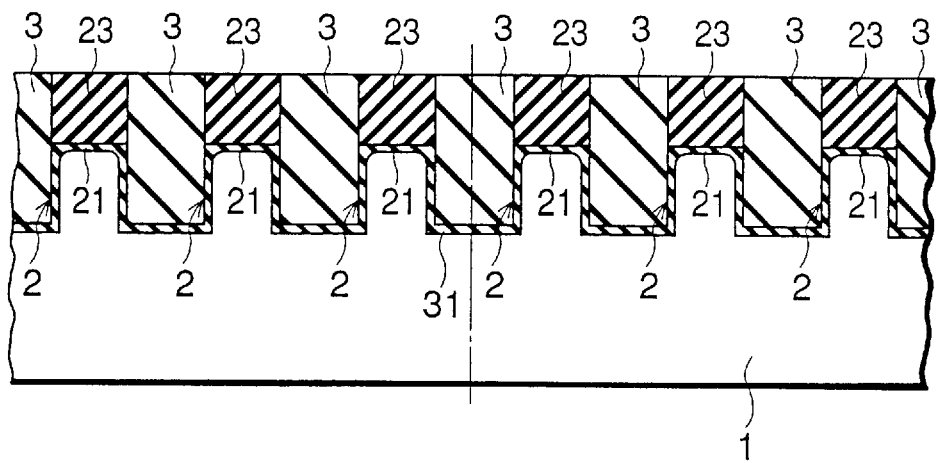
F I G. 25E
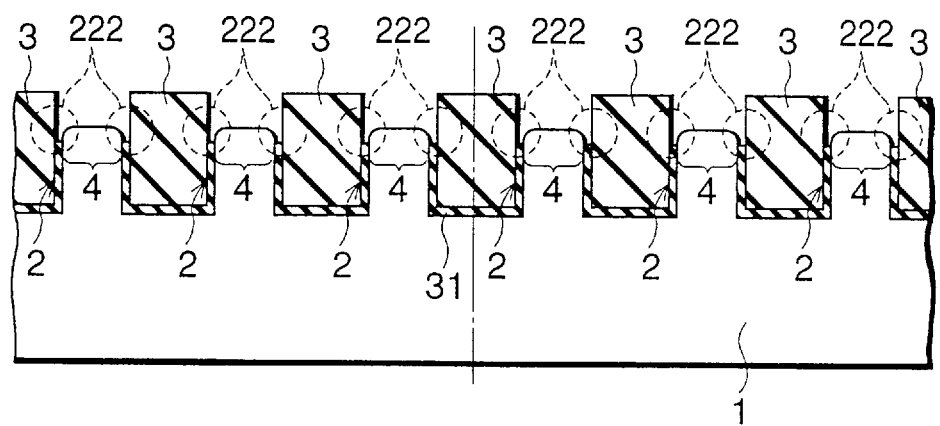
F I G. 25F

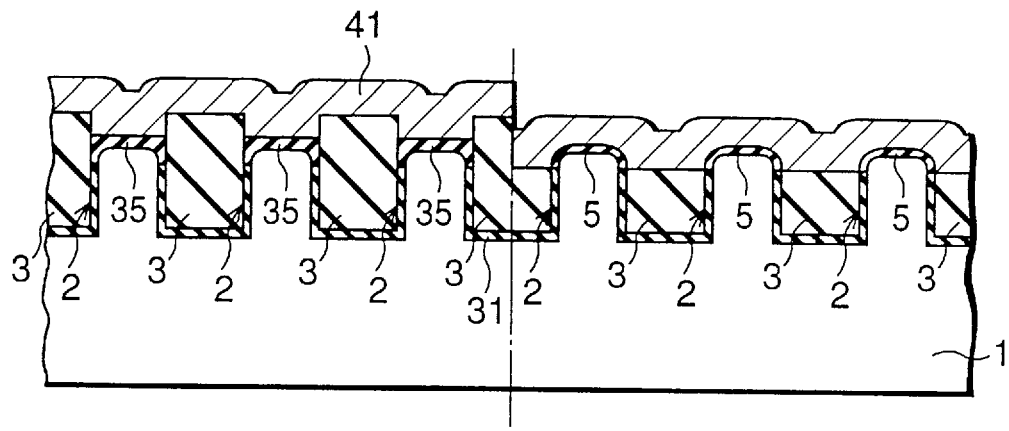
F I G. 25J
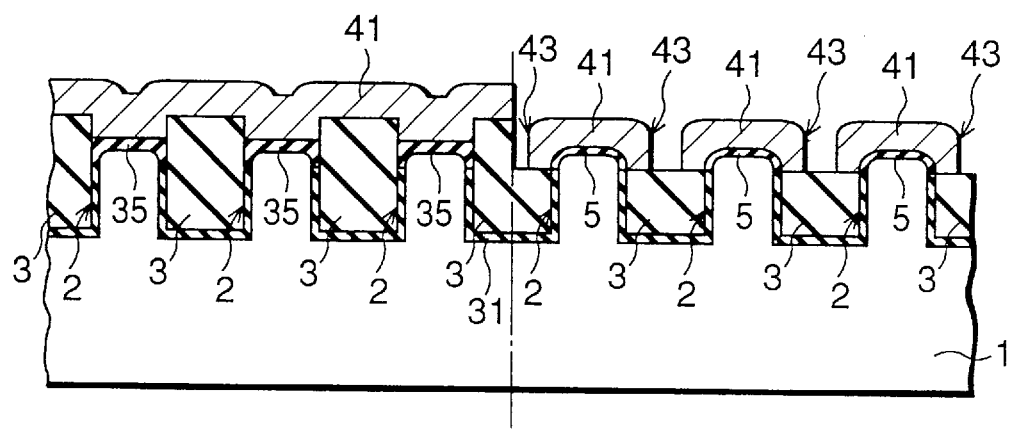
F I G. 25K

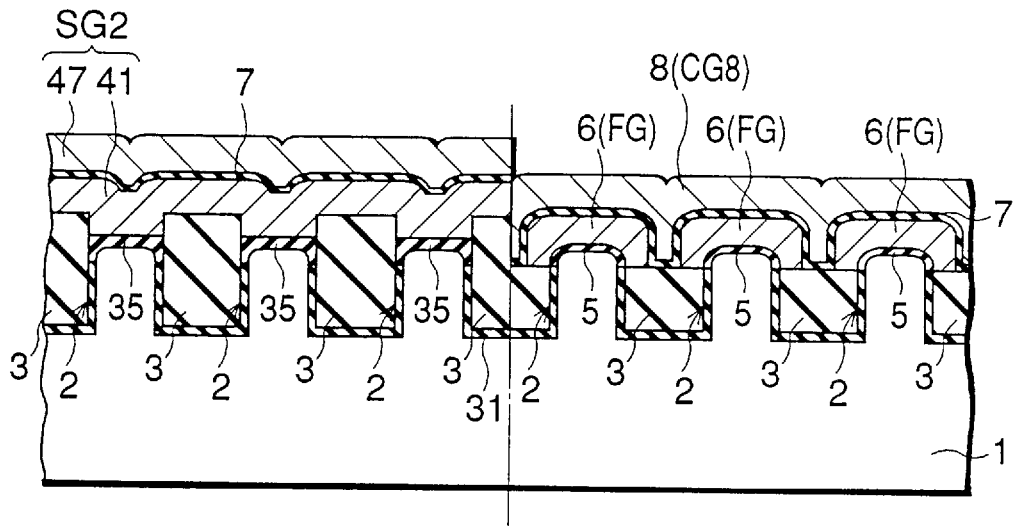
F I G. 25L
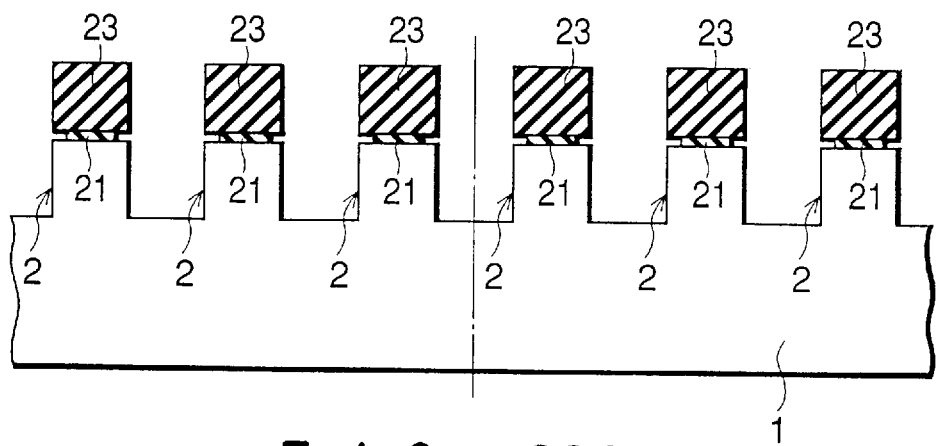
F I G. 26A

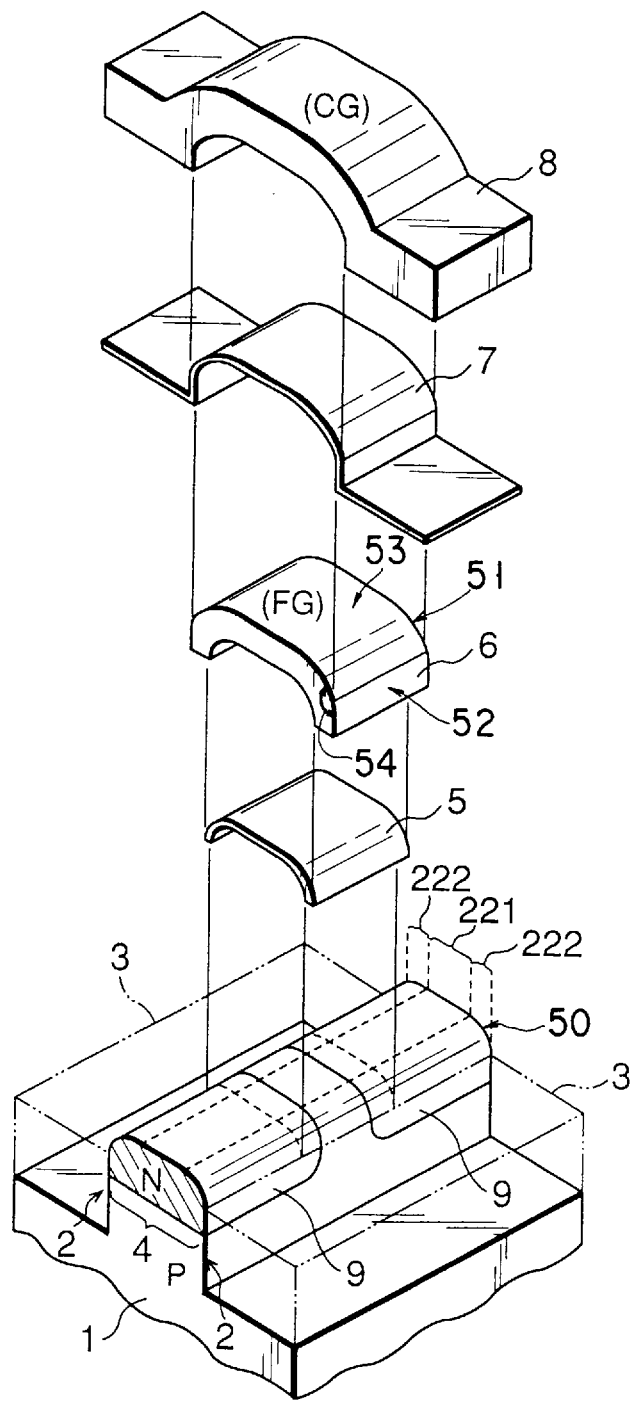
F I G. 27

NONVOLATILE SEMICONDUCTOR MEMORY DEVICE

BACKGROUND OF THE INVENTION

The present invention relates to a nonvolatile semiconductor memory device in which data is electrically written/erased.

FIG. 1 is a sectional view of the memory cell of a conventional EEPROM.

As shown in FIG. 1, LOCOS element isolation regions 103 are formed in predetermined regions of a p-type silicon substrate 101, and the portion of the silicon substrate 101 present between the LOCOS element isolation regions 103 constitutes an element region 104. A tunnel oxide film 105 is formed in the element region 104, and a floating gate 106 is formed on the tunnel oxide film 105. An ONO insulating film 107 consisting of three silicon dioxide/silicon nitride/silicon dioxide layers is formed on the floating gate 106. A control gate 108 is formed on the ONO insulating film 107.

The data write/erase with respect to the memory cell shown in FIG. 1 will be explained using a NAND-type EEPROM as an example.

The NAND-type EEPROM uses a Fowler-Nordheim (FN) electric current for both a data write and data erase.

In writing data, a potential VPP is applied to a control gate selected for a write, a potential Vm is applied to a non-selected control gate and a selection gate, and the source region and the substrate 101 are grounded. The potential of the drain region is changed to either a positive potential or the ground potential depending on level "1" or "0" of the write data.

When the drain region is grounded, a potential is applied to positively bias the floating gate 106 side, and an FN electric current flows through the tunnel oxide film 105 to inject electrons from the substrate 101 side to the floating gate 106.

In erasing data, all control gates, selection gates, drain regions, and source regions selected for an erase are grounded, while a potential VEE is applied to the substrate 101.

In this potential state, a potential is applied to positively bias the substrate 101 side, and an FN electric current flows through the tunnel oxide film 105 to discharge electrons from the floating gate 106 to the substrate 101.

In the conventional memory cell, the amount of FN electric current passing through the tunnel oxide film 105 is determined by the electric field between the floating gate 106 and the substrate 101 generated by a voltage applied across the control gate 108 and the substrate 101. For this reason, e.g., to increase the write speed, the write voltage VPP applied across the control gate 108 and the substrate 101 must be increased to strengthen the electric field between the floating gate 106 and the substrate 101. If the write voltage VPP is raised, however, particularly the gate oxide film of a peripheral transistor must be made thick, so shrinking the whole EEPROM becomes problematic. If the write voltage VPP is raised too high, it is difficult to generate it inside the EEPROM.

BRIEF SUMMARY OF THE INVENTION

The present invention has been made in consideration of the above situation, and has as its object to provide a nonvolatile semiconductor memory device in which the write speed becomes higher than that of a conventional memory cell when the write voltage applied across a control gate and a substrate is equal to that of the conventional memory cell, and the write voltage can be decreased when the write speed is equal to that of the conventional memory cell.

To achieve the above object, according to the present invention, there is provided A nonvolatile semiconductor memory device comprising: a semiconductor substrate; an element isolation region formed in the substrate; an element region set on a surface of the substrate by the element isolation region to form a memory cell; and a memory cell array prepared by arraying a plurality of electrically data erasable memory cells, each memory cell including a tunnel insulating film formed in the element region, a floating gate formed on the tunnel insulating film, and a control gate capacitively coupled to the element region through the floating gate and the tunnel insulating film, wherein at least part of the element region convexly projects toward the floating gate, and the convexly projecting portion has a curved portion substantially curvedly opposing the floating gate, and a flat portion substantially flatly opposing the floating gate.

More specifically, in the present invention, at least part of the element region is made to project, and the projecting element region has a curved portion substantially curvedly opposing the floating gate and a flat portion substantially flatly opposing it. In writing data, the electric field is concentrated at the curved portion to increase the density of tunnel electric current. With this arrangement, when the write voltage applied across the control gate and the substrate is equal to that in the conventional memory cell, the write speed becomes higher than that in the conventional memory cell.

In the present invention, a flat portion is further formed in addition to the curved portion to distribute the tunnel electric current at the curved portion so as to set the density of tunnel electric current at the curved portion at a value that does not destroy the tunnel insulating film. With this arrangement, in the memory cell having a tunnel insulating film through which a high-density tunnel electric current flows, the probability of tunnel insulating film destruction can be reduced. Alternatively, the service life of the tunnel insulating film becomes long enough for practical use.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2A is a plan view of the memory cell array of a NAND-type EEPROM according to the first embodiment of the present invention;

FIG. 2B is a sectional view taken along the line 2B—2B in FIG. 2A;

FIG. 2C is a sectional view taken along the line 2C—2C in FIG. 2A;

FIG. 3 is a view showing the electric line of force generated between a substrate and a floating gate shown in FIG. 2B;

FIG. 4 is an energy band diagram between the substrate and the floating gate shown in FIG. 2B;

FIG. 5 is a graph showing the radius dependence of the ratio of electric fields $E_{edge}$ and $E_{flat}$;

FIG. 6 is a graph showing the electric field dependence of FN the electric current;

FIG. 7 is a graph showing the radius dependence of the ratio of FN electric currents $I_{flat}$ and $I_{edge}$ in a write;

FIG. 8 is a graph showing the electric field dependence of the FN electric current;

FIG. 16 is a sectional view of the second memory cell according to the third embodiment of the present invention;

FIG. 17 is a circuit diagram of the memory array of a NAND-type EEPROM;

FIG. 22 is a circuit diagram of the memory cell array of a DINOR (DIvided NOR)-type EEPROM;

FIG. 24 is a plan view of the memory cell array of a NAND-type EEPROM according to the fourth embodiment of the present invention;

FIGS. 25A to 25L are sectional views, respectively, showing the process of manufacturing the memory cell according to the fourth embodiment of the present invention;

FIGS. 26A to 26C are sectional views, respectively, showing the process of manufacturing a memory cell according to the fifth embodiment of the present invention; and FIG. 27 is an exploded perspective view showing the memory cell according to the embodiments of the present invention.

DETAILED DESCRIPTION OF THE INVENTION

Figure 1:
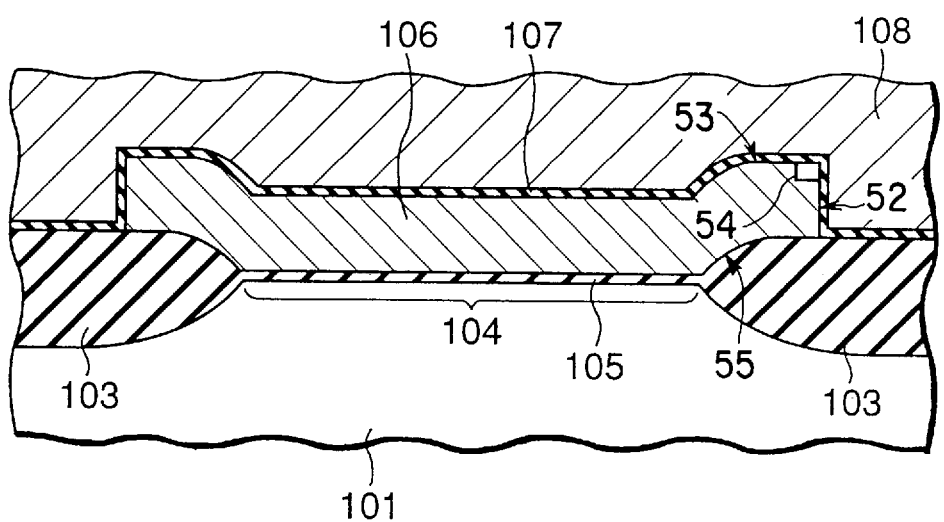
FIG. 1 is sectional view of the memory cell of a conventional EEPROM.

An embodiment of the present invention will be described below with reference to the several views of the accompanying drawing.

FIG. 2A is a plan view of the memory cell array of a NAND-type EEPROM according to the first embodiment of the present invention. FIG. 2B is a sectional view taken along the line 2B—2B in FIG. 2A, and FIG. 2C is a sectional view taken along the line 2C—2C in FIG. 2A.

The basic structure of the memory cell of the NAND-type EEPROM according to the first embodiment of the present invention will be first described.

As shown in FIGS. 2A to 2C, a plurality of trenches 2 are formed parallel to each other in a p-type silicon substrate (or p-type well) 1. Each trench 2 is filled with an insulator to form a buried element isolation region 3. The buried element isolation region 3 described in this embodiment is sometimes called an STI (Shallow Trench Isolation). The buried insulator is, e.g., silicon dioxide ($SiO_2$). The portions of the substrate 1 present between the buried element isolation regions 3 constitute element regions 4. A tunnel oxide film ($SiO_2$) 5 is formed in each element region 4, and a floating gate (FG) 6 is formed on the tunnel oxide film 5. An ONO insulating film 7 consisting of three silicon dioxide ($SiO_2$) /silicon nitride ($Si_3N_4$)/silicon dioxide ($SiO_2$) layers is formed on the floating gate 6. A control gate (CG) 8 is formed on the ONO insulating film 7.

The data write/erase with respect to the memory cell of the NAND-type EEPROM according to the first embodiment of the present invention will be explained below.

In FIGS. 2A to 2C, reference symbol S denotes n-type source regions; D, n-type drains; CG1 to CG8, control gates; SG1, drain-side selection gates; SG2, source-side selection gates; and BL, bit lines connected to the drain regions D. Each bit line contact shown in FIG. 2A represents a contact portion between a bit line and a drain region D. A portion not shown in FIG. 2A (e.g., the end of the cell array) has contact portions between the source lines and the source regions S, i.e., the source line contacts. Reference numeral 9 denotes n-type regions where selection gate transistors and memory cell transistors are series-connected between the source and drain regions S and D.

The NAND-type EEPROM uses a Fowler-Nordheim (FN) electric current for both a data write and data erase.

In writing data, the potential VPP is applied to a control gate CG selected for a write, the potential Vm is applied to non-selected control gates CG and the selection gates SG1 and SG2, and the source region S and the substrate 1 are grounded. The potential of the drain region D is changed to either a positive potential or the ground potential depending on level "1" or "0" of the write data. Particularly when the drain region D is grounded, a potential is applied to positively bias the floating gate 6 side, and an FN electric current flows through the tunnel oxide film 5 to inject electrons from the substrate 1 side to the floating gate 6.

In erasing data, all the control gates CG, the selection gates SG1 and SG2, the drain regions D, and the source regions S selected for an erase are grounded, while the potential VEE is applied to the substrate 1. In this potential state, a potential is applied to positively bias the substrate 1 side, and an FN electric current flows through the tunnel oxide film 5 to discharge electrons from the floating gate 6 to the substrate 1.

The structure of the memory cell of the NAND-type EEPROM according to the first embodiment of the present invention will be described in more detail below. For the sake of descriptive convenience of the present invention, the sectional structure shown in FIG. 2B is categorized into edge portions 222 along the boundaries between the element isolation regions 3 and the element region 4, and a flat portion 221 between the edge portions 222.

As shown in FIG. 2B, the insulator filling each trench 2 recedes from the surface of the substrate 1 and the element region 4 projects from the surface of the buried element isolation region 3. At the flat portion 221 of the projecting element region 4, the tunnel oxide film 5 is completely flat because the tunnel oxide film 5 is formed after the surface of the substrate 1 is subjected to dummy oxidation, and the dummy oxide film ($SiO_2$) formed by the dummy oxidation is peeled. To the contrary, since the edge portion 222 is rounded, the tunnel oxide film 5 at the edge portion 222 is round in accordance with the shape of the edge portion 222. The floating gate 6 is formed on the tunnel oxide film 5 into a shape covering the projecting element region 4. With this shape, the floating gate 6 opposes both the rounded edge portion 222 and the flat portion 221.

The electric field generated in the memory cell shown in FIG. 2B will be explained below.

Microscopically, a radius R of the element region 4 at the edge portion 222 is considered to differ depending on the location, and be not constant in general. The electric field is maximized at a portion having the largest curvature, i.e., a portion having the smallest radius R. Of various values of the radius, the minimum value is defined as the radius R. The equation of the electric field generated in the memory cell shown in FIG. 2B is derived as follows.

In writing data, assuming that t is the thickness of the tunnel oxide film 5, the following equation holds according to the Gauss's theorem:

$$E_{edge} = \frac{t}{R\ln\left(1 + \frac{t}{R}\right)} E_{flat} \quad (1)$$

In equation (1) above, the electric field $E_{edge}$ is the maximum electric field at the edge portion 222 in writing data (i.e., the gate is positively biased), and the electric field $E_{flat}$ is the one at the flat portion 221. From equation (1), as the radius R decreases, the electric field $E_{edge}$ becomes larger. To the contrary, as the radius R increases, the value of the electric field $E_{edge}$ decreases nearer to the value of the electric field $E_{flat}$. That is, in the memory cell shown in FIG. 2B, the electric field generated at the rounded edge portion 222 is larger than that generated at the flat portion 221. In writing data, electrons are injected from the substrate 1 side to the floating gate 6 by using an FN electric current. Therefore, in the memory cell shown in FIG. 2B, the density of FN electric current flowing through the edge portion 222 is higher than that of the FN electric current flowing through the flat portion 221.

FIG. 3 is a view showing the electric line of force generated between the substrate and the floating gate shown in FIG. 2B, and FIG. 4 is an energy band diagram between the substrate and the floating gate shown in FIG. 2B. FIG. 4 shows the energy band generated at the edge portion 222 particularly in a write.

When the write voltage VPP is applied across the substrate 1 and the control gate 8, the potential difference is the same at any portions of the tunnel oxide film 5. However, the FN electric current concentratedly flows through the edge portion 222 because the energy band at the edge portion 222 is warped. This state is shown in FIG. 4.

FIG. 5 is a graph showing the radius dependence of the ratio of the electric fields $E_{edge}$ and $E_{flat}$, i.e., showing equation (1) above. Note that FIG. 5 shows not only the ratio in a write but also the ratio in an erase.

In a write, the concentration degree of the electric field tends to increase as the radius R decreases, or to decrease as the radius R increases. Although the same trend is exhibited in an erase, the decrease in the concentration degree of the electric field along with an increase in radius R is not larger than that in a write.

The memory cell shown in FIG. 2B has the following effects in a write.

Since the energy band is warped at the edge portion 222, the FN electric current concentratedly flows through the rounded edge portion 222. As a result, the write speed becomes higher than that of a memory cell having no rounded edge portion 222. If the write speed is constant, the write voltage VPP can be set low.

In an erase, since electrons are discharged from the floating gate 6 to the substrate 1, the electric field does not concentrate at the rounded edge portion 222, unlike in a write. The FN electric current mainly flows through the flat portion 221. In the NAND-type EEPROM, electrons are discharged to the channel portion of the substrate 1; in the NOR-type EEPROM, they are discharged to the drain region serving as a diffusion layer. In either type, the FN electric current is used.

As described above, the tunnel oxide film 5 and the floating gate 6 are formed to cover the element region 4 projecting higher than the buried element isolation region 3. When the electric field concentrates at the boundary portion between the element isolation region 3 and the element region 4 in a write, the FN electric current concentratedly flows through the portion where the electric field concentrates.

FIG. 6 is a graph showing the electric field dependence of the FN electric current.

The FN electric current is given by the following equation:

$$J = AE^2 \exp\left(-\frac{B}{E}\right) \quad (2)$$

As shown in FIG. 6, if the electric field changes by only 1 MV/cm, the density of FN electric current increases by two orders of magnitudes. In this manner, the FN electric current is sensitive to the electric field. Assuming that the width (channel width) of the element region 4, the radius of the edge portion 222, and the thickness of the tunnel oxide film 5 are represented by α, R, and t, the FN electric current flowing through the tunnel oxide film 5 of the memory cell shown in FIG. 2B is expressed from equations (1) and (2) above as:

$$I(R, E) \propto (\alpha - 2R)E^2 \exp\left(-\frac{B}{E}\right) + \pi R \left(\frac{t}{R\ln\left(1 + \frac{t}{R}\right)}\right)^2 E^2 \exp\left(\frac{-BR\ln\left(1 + \frac{t}{R}\right)}{tE}\right) \quad (3)$$

According to relation (3), e.g., in a memory cell having an element region 4 with a width a of 0.4 μm and an edge portion 222 with a radius R of 10 nm, up to 99.5% of the amount of electric charges passing through the tunnel oxide film 5 passes through the rounded edge portion 222 in a write.

FIG. 7 is a graph showing the radius dependence of the ratio of FN electric currents $I_{flat}$ and $I_{edge}$ in a write.

In FIG. 7, the relationship between the ratio of the FN electric current $I_{flat}$ flowing through the flat portion 221 to the FN electric current $I_{edge}$ flowing through the rounded edge portion 222, and the radius R, as defined by relation (3) above, is plotted using the width (SDG Width) α of the element region 4 as a parameter.

FIG. 8 is a graph showing the electric field dependence of the FN electric current.

In FIG. 8, relation (3) itself is plotted using the radius R as a parameter.

As shown in FIGS. 7 and 8, as the radius R decreases, the FN electric current component abruptly increases at the rounded edge portion 222.

Also in an erase, the relation of the FN electric current is determined by the same calculation.

Figure 9:
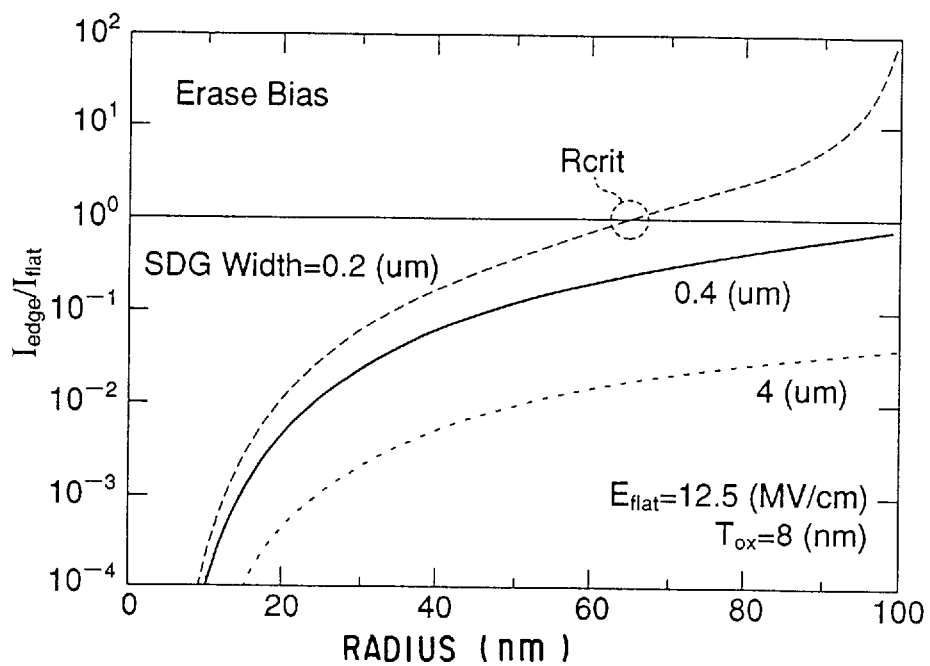
FIG. 9 is a graph showing the radius dependence of the ratio of the FN electric currents $I_{flat}$ and $I_{edge}$ in an erase.

FIG. 9 is a graph showing the radius dependence of the ratio of the FN electric currents $I_{flat}$ and $I_{edge}$ in an erase.

In FIG. 9, the relationship between the ratio of the FN electric current $I_{flat}$ flowing through the flat portion 221 to the FN electric current $I_{edge}$ flowing through the rounded edge portion 222, and the radius R is plotted using the width (SDG Width) of the element region 4 as a parameter.

As shown in FIG. 9, when the radius R is small, most of the FN electric current components flow through the flat portion 221.

Figure 10:
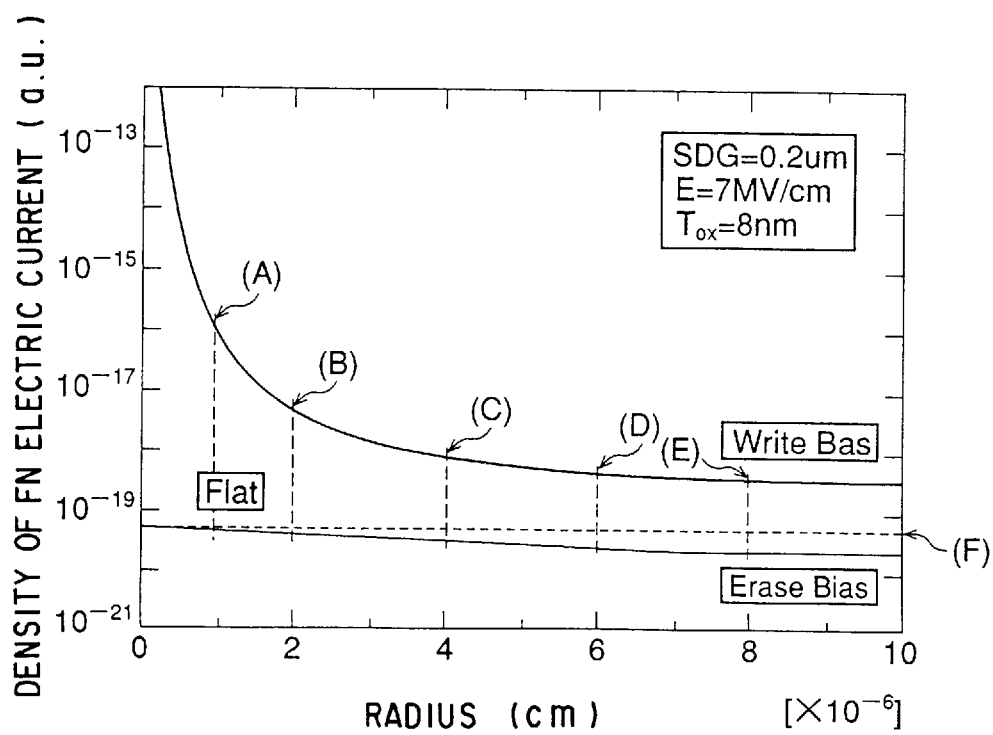
FIG. 10 is a graph showing the radius dependence of the density of FN electric current in a write/erase.

FIG. 10 is a graph showing the radius dependence of the density of FN electric current in a write/erase.

FIG. 10 shows the dependence obtained when a memory cell having an element region 4 with a width (SDG Width) of 0.2 μm and a tunnel oxide film 5 with a thickness $T_{ox}$ of 8 nm is used, and the electric field $E_{flat}$ is 7 MV/cm. In a write, if the radius R decreases to 0.01 μm or less, the density of FN electric current abruptly increases. In an erase, as the radius R increases, the density of FN electric current gradually decreases.

In general, as the passing charge amount per unit area increases, and as the applied electric field becomes larger, a breakdown time $t_{BD}$ of the tunnel oxide film shortens. For this reason, when the radius R decreases to strengthen the electric field at the edge portion 222 to a certain degree, the breakdown time $t_{BD}$ per memory cell shortens extremely, and such a memory cell cannot be practically used. If the radius R is large, the breakdown time $t_{BD}$ does not shorten extremely, but the electric field concentration effect lowers. Therefore, the size of the radius R must be set within an optimal range.

The optimal range of the radius R will be examined below.

Figure 11A:
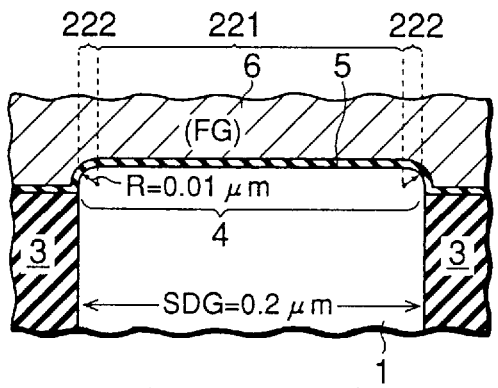
FIGS. 11A to 11F are sectional views of memory cells, respectively.
Figure 11D:
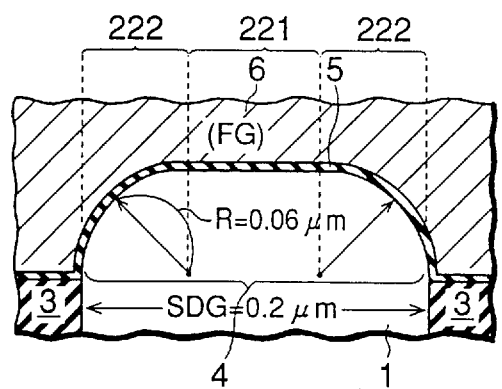
Figure 11B:
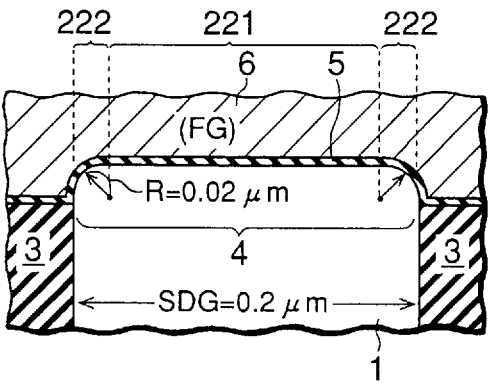
Figure 11E:
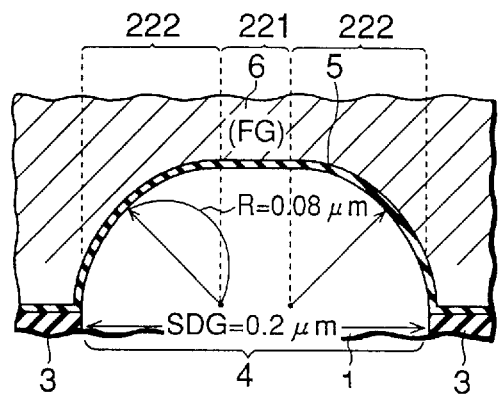
Figure 11C:
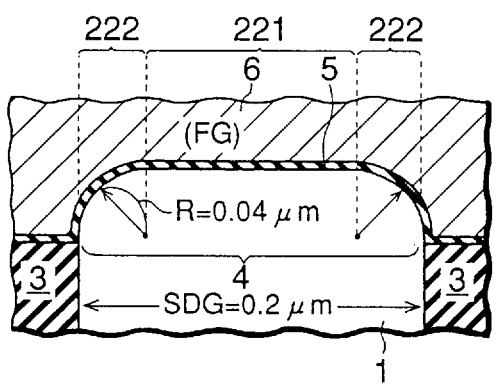
Figure 11F:
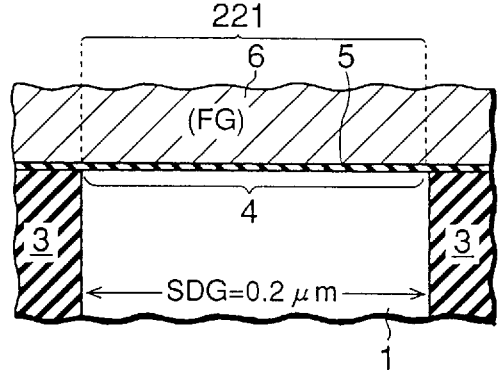

FIGS. 11A to 11F are sectional views of memory cells, respectively. FIG. 11A shows a memory cell when the radius R=0.01 μm, FIG. 11B shows one when the radius R=0.02 μm, FIG. 11C shows one when the radius R=0.04 μm, FIG. 11D shows one when the radius R=0.06 μm, and FIG. 11E shows one when the radius R=0.08 μm. FIG. 11F is a sectional view of a memory cell having no rounded edge portion 222 not utilizing the electric field concentration. This memory cell was fabricated to examine how the density of FN electric current change depending on the presence/absence of the rounded edge portion 222. The memory cell shown in FIG. 11F is equivalent to a typical memory cell except that the element isolation region is of the buried-type or the LOCOS-type. Note that the widths (channel widths) of the element regions 4 of the memory cells shown in FIGS. 11A to 11F are all 0.2 μm.

In the memory cell shown in FIG. 11F, the density of FN electric current passing through the tunnel oxide film 5 is the same in both a write and erase. In FIG. 10, the memory cell shown in FIG. 11F is denoted by reference symbols "(F)" and "Flat".

To the contrary, in the memory cells shown in FIGS. 11A to 11E, the density of FN electric current passing through the tunnel oxide film 5 is different in a write and erase. Further, the density of FN electric current differently changes depending on the size of the radius R. In FIG. 10, the memory cells shown in FIGS. 11A to 11E are denoted by reference symbols "(A)", "(B)", "(C)", "(D)", and "(E)", respectively.

As shown in FIG. 10, in each of the memory cells shown in FIGS. 11A to 11E wherein the element region 4 is rounded to project at the edge portion 222 with respect to the element isolation region 3, and the floating gate 6 is formed on the tunnel oxide film 5 which covers the projecting element region 4, the density of FN electric current in a write is higher than that in the memory cell shown in FIG. 11F. As the radius R increases, the density of FN electric current passing through the tunnel oxide film 5 in a write gradually decreases, but is always higher than that in the memory cell shown in FIG. 11F. In this manner, in the memory cells shown in FIGS. 11A to 11E, the density of FN electric current effectively increases in a write. Therefore, the write characteristics can be improved to increase the write speed or decrease the write voltage VPP.

In an erase, in the memory cells shown in FIGS. 11A to 11E, as the radius R increases, the density of FN electric current gradually decreases, compared to the memory cell shown in FIG. 11F. This is because, in an erase, unlike in a write, the electric field $E_{flat}$ applied to the flat portion 221 becomes larger than the electric field $E_{edge}$ applied to the edge portion 222, and the FN electric current mainly passes through the flat portion 221, as described above.

Figure 12:
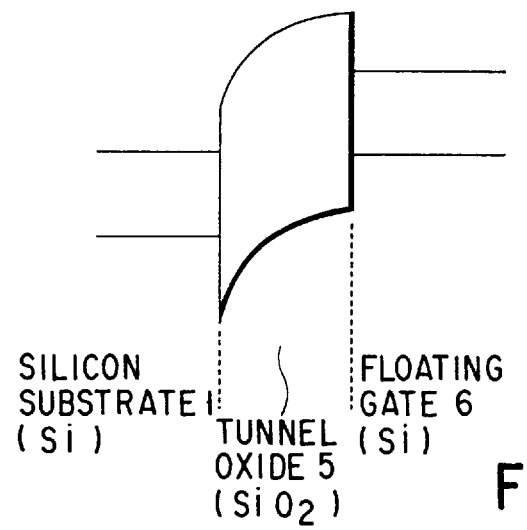
FIG. 12 is an energy band diagram between the substrate and the floating gate.

FIG. 12 is an energy band diagram between the substrate and the floating gate. FIG. 12 shows the energy band generated at the edge portion 222 in an erase.

From the above viewpoint, as the first measure for efficiently improving the write characteristics while suppressing deterioration of the erase characteristics, the flat portion 221 is formed in the element region 4, together with the rounded edge portion 222, and the flat portion 221 is made wider to a certain degree. To implement the first measure, the upper limit of the radius R is defined to make the flat portion 221 wider to a certain degree. An example of the definition of the upper limit of the radius R will be described below.

When the width of the element region 4 of one memory cell is represented by W, and the minimum value of the radius is represented by R, the radius R (minimum value) is set to satisfy the following relation:

$$R < \frac{W}{3} \qquad (4)$$

Note that W in relation (4) is strictly defined by the width of a portion of the element region 4, that opposes the floating gate in substantially the same horizontal direction as the direction of the radius R, and is equivalent to the channel width in the memory cells shown in FIGS. 11A to 11E. The value ⅓ in relation (4) above corresponds to a portion around which the electric current amount of the FN electric current $I_{edge}$ passing through the edge portion 222, and that of the FN electric current $I_{flat}$ passing through the flat portion 221 are reversed. In FIG. 9, a radius Rcrit represents the radius R when the electric current amounts are reversed. When the width (SDG Width) of the element region 4 is 0.2 μm, the radius $R_{crit}$ falls within the range of 65 to 67 nm. If the radius R falls within the range that satisfies relation (4) above, the write characteristics can be efficiently improved while suppressing deterioration of the erase characteristics. Note that FIG. 9 does not show the radius $R_{crit}$ when the width (SDG Width) of the element region 4 is 0.4 µm or 4 µm. However, the curves suggest that the electric current amount of the FN electric current $I_{edge}$ and that of the FN electric current $I_{flat}$ are reversed when radius R is about ⅓ the width of the element region 4.

As the second measure for efficiently improving the write characteristics while suppressing deterioration of the erase characteristics, the amount of electric charges passing through the tunnel oxide film 5 per unit time in an erase is increased as much as possible. To implement the second measure, the lower limit of the amount of electric charges passing through the tunnel oxide film 5 (per unit time) is defined. An example of the definition of the passing charge amount per unit time will be described below.

Under the condition of a constant potential difference (or average electric field) when electrons are discharged from the floating gate 6 to the substrate 1, the amount of electric charges passing through the tunnel oxide film 5 per unit time is represented by J (R), and the amount of electric charges passing through the tunnel oxide film 5 per unit time is represented by J (R=0) for the radius R=0 (e.g., the memory cell shown in FIG. 11F). At this time, the passing charge amount is set to satisfy the following relation:

$$J(R) > 0.5 \times J(R=0) \tag{5}$$

By defining the passing charge amount not to decrease by half in an erase, as shown in relation (5), an increase in total time required for a simultaneous data erase can be suppressed to a negligible degree for practical use. Furthermore, there may be a case where the simultaneous data erase includes not only a data erase but also a data write of making data in all memory cells selected for an erase consistent in order to prevent overerase. In the memory cell according to the present invention, the time required for the write can be shortened because the write speed can be increased, as described above. If the passing charge amount per unit time falls within the range that satisfies relation (5), the increase in time of the simultaneous data erase can be suppressed to a negligible degree for practical use.

The upper limit of the radius R (minimum value) has been described. The lower limit of the radius R will be described below.

As shown in FIG. 10, as the radius R decreases, the concentration degree of the electric field can be increased to effectively increase the write speed or decrease the write voltage VPP. However, if the concentration degree of the electric field becomes too high, the breakdown time $t_{BD}$ may abruptly shorten to shorten the service life of the memory cell for practical use.

From this viewpoint, it is desirable to attain a memory cell having a service life long enough for practical use while maximally improving the write characteristics. For this purpose, the lower limit of the radius R is defined. An example of the definition of the lower limit of the radius R will be described below.

When the value of the radius R is changed, the relationship between the electric fields $E_{edge}$ and $E_{flat}$ is set to satisfy the following relation:

$$E_{edge}(R) < 1.5 \times E_{flat}(R) \tag{6}$$

By setting the electric field $E_{edge}$ to be 1.5 times or less the electric field $E_{flat}$, as shown in relation (6), the decrease in the breakdown time $t_{BD}$ can be minimized.

Further, from equation (1) above relation (6) can be rewritten:

$$\frac{t}{R \ln\left(1 + \frac{t}{R}\right)} < 1.5 \tag{7}$$

Relation (7) defines the lower limit of the radius R for attaining a memory cell having a service life long enough for practical use while maximally improving the write characteristics. In this case, even when the thickness of the tunnel oxide film 5 at the edge portion 222 varies slightly, the thickness t in relation (7) can be set to a value at the flat portion 221 of the element region 4 without posing any problem.

Figure 13A:
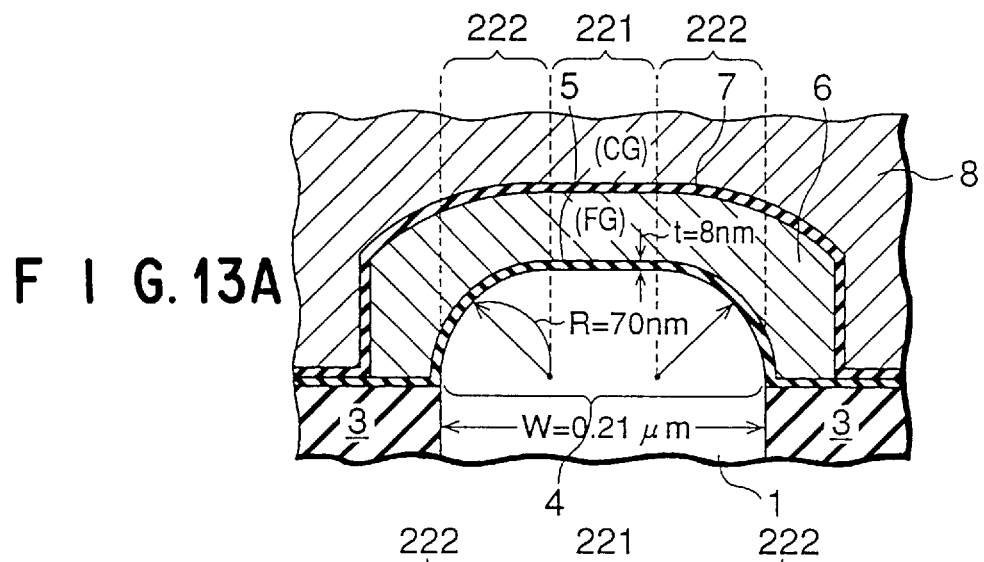
FIG. 13A is a sectional view when the radius R takes the upper limit value.
Figure 13B:
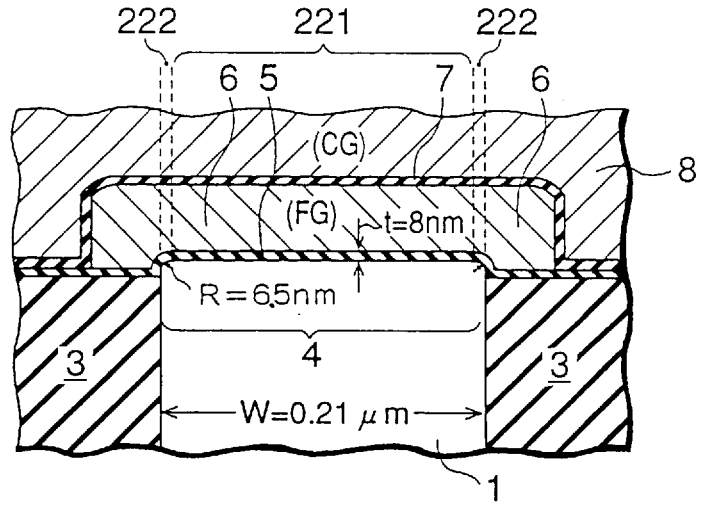
FIG. 13B is a sectional view when the radius R takes the lower limit value.

FIG. 13A is a sectional view when the radius R takes the upper limit value, and FIG. 13B is a sectional view when the radius R takes the lower limit.

The widths of the element regions 4 of memory cells shown in FIGS. 13A and 13B are 0.21 µm, and the thicknesses of the tunnel oxide films 5 are 8 nm. In the memory cell having this size, the upper limit of the radius R is 70 nm (FIG. 13A) from relation (4) above, and the lower limit thereof is 6.5 nm (FIG. 13B) from relation (7) above. Generally, the minimum value R of the radius is simply set within the range of 3 to 100 nm in accordance with the channel width of the memory cell and the thickness of the tunnel oxide film 5 so as to satisfy the definition of the upper and lower limits for attaining desired write and erase characteristics. The channel width of the memory cell, the thickness of the tunnel oxide film 5, and the like are variously changed as far as the feature size shrink requirement is met. Even when the channel width of the memory cell and the thickness of the tunnel oxide film 5 are variously changed in this manner, if the upper end portion of the element region is rounded to set the minimum value R of the radius within the range of 3 nm to 100 nm, it can be shaped suitable for practical use while meeting the feature size shrink requirement.

The lower limit of the radius R can be defined as follows. When the value of the radius R is changed, the relationship between an amount $Q_{edge}$ (R) of electric charges passing through the edge portion 222 per unit time, and an amount $Q_{flat}$ (R) of electric charges passing through the flat portion 221 per unit time is set to satisfy relation (8):

$$Q_{edge}(R) < 10^5 \times Q_{flat}(R) \tag{8}$$

With this setting, the breakdown time $t_{BD}$ can be minimized.

More specifically, FIG. 7 is a graph showing the radius dependence of the current ratio at the edge and flat portions 222 and 221. The passing charge amount per unit time actually means the current. This graph reveals that if the radius R greatly decreases, the ratio of the passing charge amount exceeds $10^5$. At a higher ratio, a large amount of current flows through the edge portion 222, the breakdown time greatly shortens, and the memory cell cannot be practically used.

The memory cell of a NAND-type EEPROM according to the second embodiment of the present invention will be described below.

Figure 14:
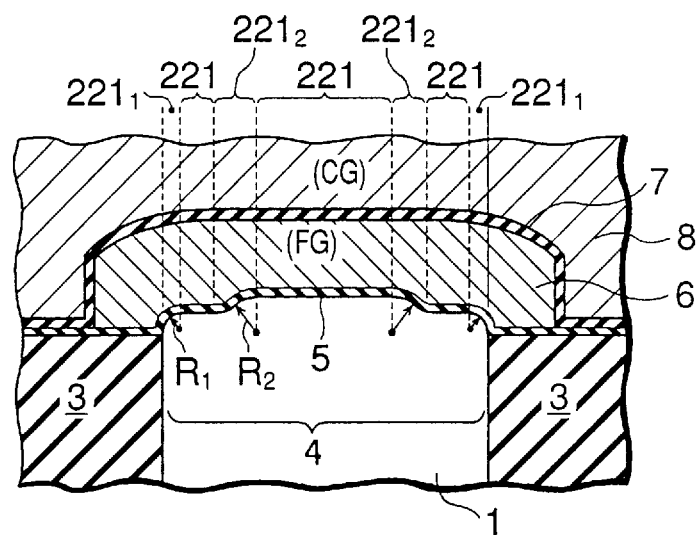
FIG. 14 is a sectional view of a memory cell according to the second embodiment of the present invention.

FIG. 14 is a sectional view of the memory cell of a NAND-type EEPROM according to the second embodiment of the present invention.

In an actual memory cell, the curvature of an edge portion 222 is not constant but distorted. For example, in the memory cell shown in FIG. 14, an edge portion $222_1$ having a low curvature, and an edge portion $222_2$ having a high curvature exist in addition to a flat portion 221. In this memory cell, when the electric field at the flat portion 221 is represented by $E_0$, that at the edge portion $222_1$ is represented by $E_1$, and that at the edge portion $222_2$ is represented by $E_2$, the following relation holds:

$$E_1 > E_2 > E_0 \qquad (9)$$

As shown in relation (9), the most concentrated portion of the electric field in a tunnel oxide film 5 is the edge portion $222_1$. If a radius $R_1$ of the edge portion $222_1$ is adjusted to fall within the range described in the above embodiment, no problem arises when the edge portion 222 is distorted. That is, when a plurality of radii $R_1$ and $R_2$ exist, the smaller radius ($R_1$) is set within the range defined by relation (4) for defining the upper limit, relation (7) for defining the lower limit, and the like.

The memory cell of a NAND-type EEPROM according to the third embodiment of the present invention will be described below.

Figure 15:
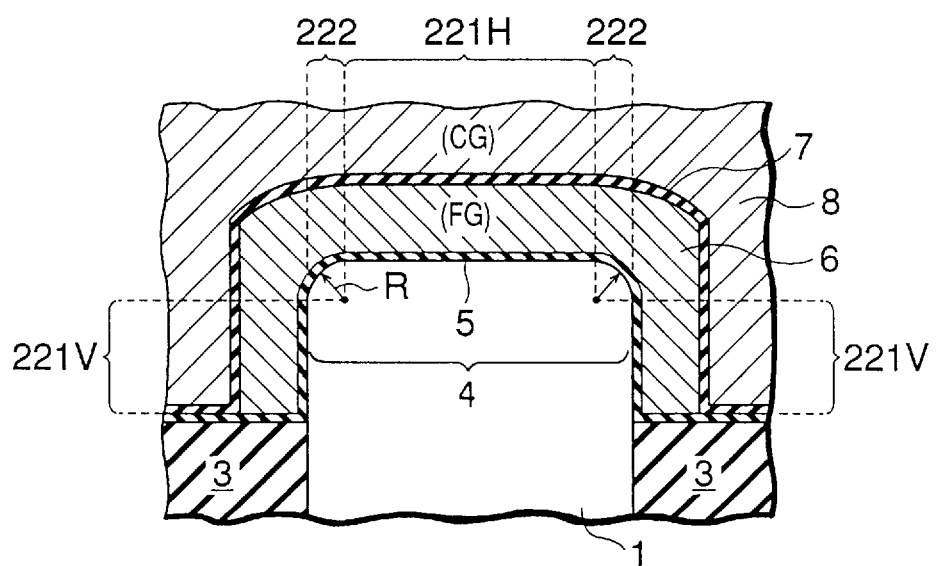
FIG. 15 is a sectional view of the first memory cell according to the third embodiment of the present invention.

FIG. 15 is a sectional view of the memory cell of a NAND-type EEPROM according to the third embodiment of the present invention.

In the first and second embodiments, the boundaries between the buried element isolation regions 3 and the element region 4 are defined as the edge portions 222, and the portion between these edge portions 222 is defined as the flat portion 221. However, the structure for concentrating the electric field is not limited to this structure, and may be another structure.

In the third embodiment, a flat portion, and a curved portion where the electric field concentrates, are determined by the size of the radius R. This is because a portion capable of concentrating the electric field, and the concentration degree, are determined by the size of the radius R.

In the third embodiment, the flat portion, and the curved portion where the electric field concentrates, are defined by the following relations.

A region serving as a curved portion where the electric field concentrates has the value of the radius R defined by $$R < \frac{W}{3} \qquad (10)$$

A region serving as a flat portion has the value of the radius R defined by $$R \geq \frac{W}{3} \qquad (11)$$

From the definitions based on relations (10) and (11), the present invention can be applied to not only a cell using buried element isolation, but also a cell using LOCOS-type element isolation and having a non-flat element region 4. Two types of memory cells according to the third embodiment will be described below.

FIG. 15 is a sectional view of the first memory cell of the NAND-type EEPROM according to the third embodiment of the present invention.

As shown in FIG. 15, edge portions 222 exist at the boundaries between buried element isolation regions 3 and an element region 4 defined by these element isolation regions 3. Each edge portion 222 includes not only the rounded edge portion 222 but also a flat portion 221V. A flat portion 221H exists between the edge portions 222.

FIG. 16 is a sectional view of the second memory cell of the NAND-type EEPROM according to the third embodiment of the present invention.

As shown in FIG. 16, no rounded edge portion 222 exists between LOCOS-type element isolation regions 3' and an element region 4 defined by these element isolation regions 3'. Instead, a projecting portion 223 exists at almost the center of the element region 4. The corner of the projecting portion 223 has a curved surface with the radius R.

As shown in FIGS. 15 and 16, the flat portion, and the curved portion where the electric field concentrates, can be discriminated from each other on the basis of the size of the curvature of the element region 4. The curvature of the curved portion where the electric field concentrates is determined by the above-described radius R.

An EEPROM to which the present invention can be applied will be explained below.

FIG. 17 is a circuit diagram of the memory array of a NAND-type EEPROM.

As shown in FIG. 17, in the NAND-type EEPROM, bit-line-side selection gates, series-connected memory cell groups, and source-line-side selection gates are series-connected between the bit lines BL and the source lines VS. It is particularly preferable to use the memory cell according to the present invention for the NAND-type EEPROM, as described in the first to third embodiments. However, the memory cell according to the present invention can be applied to, e.g., NOR-type, DINOR-type, and AND-type EEPROMs, in addition to the NAND-type EEPROM.

Figure 18:
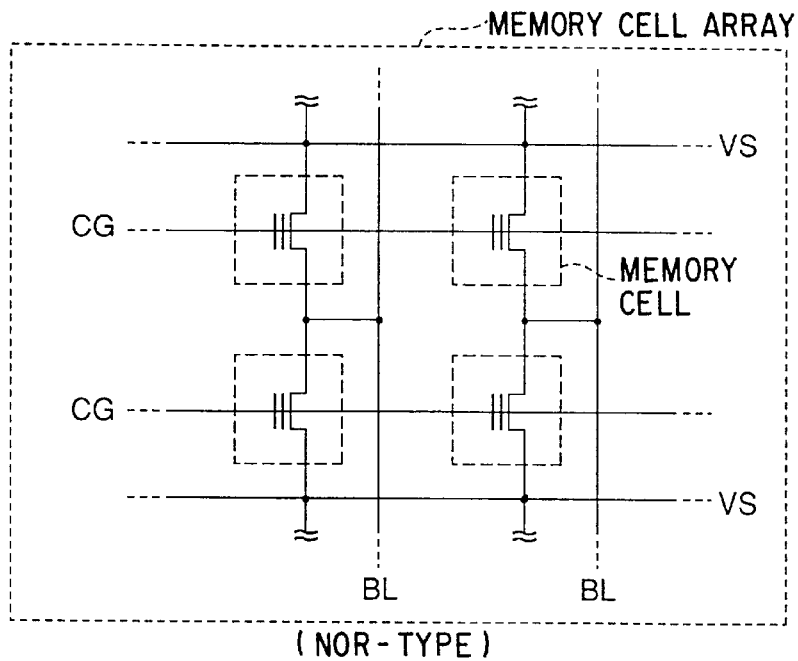
FIG. 18 is a circuit diagram of the memory cell array of a NOR-type EEPROM having no selection gate.
Figure 19:
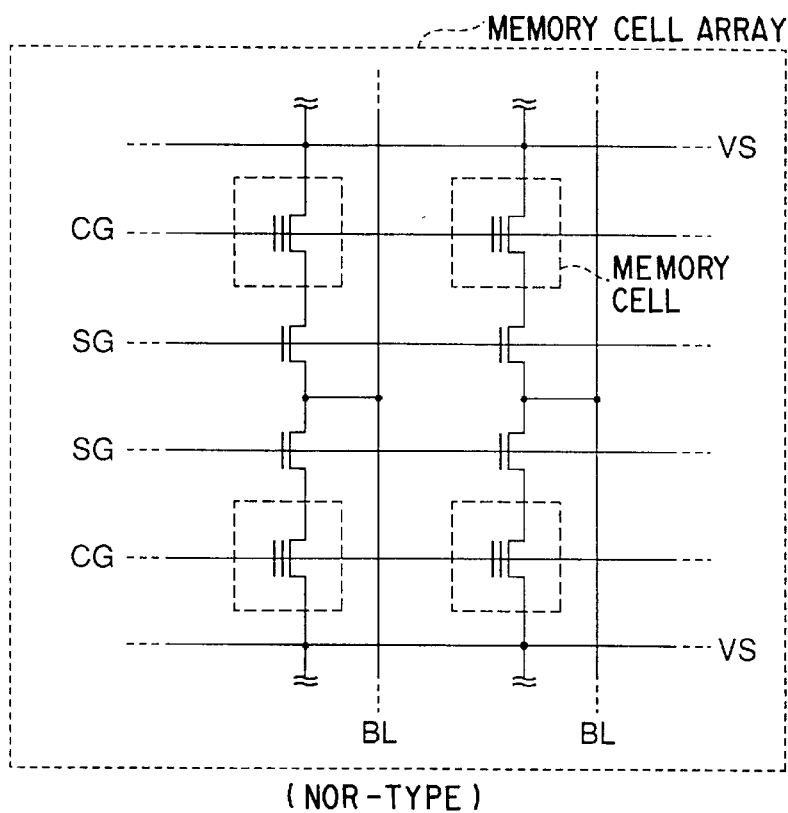
FIG. 19 is a circuit diagram of the memory cell array of the NOR-type EEPROM having a selection gate.

FIGS. 18 and 19 are circuit diagrams of the memory cell arrays of NOR-type EEPROMs, respectively. FIG. 18 is a circuit diagram when no selection gate exists, and FIG. 19 is a circuit diagram when a selection gate exists.

In the NOR-type EEPROM, one memory cell is series-connected between the bit line BL and the source line VS extending in a direction perpendicular to the bit line BL, as shown in FIG. 18. Alternatively, a bit-line-side selection gate and one memory cell are series-connected between the bit line BL and the source line VS extending in the direction perpendicular to the bit line BL, as shown in FIG. 19.

Figure 20:
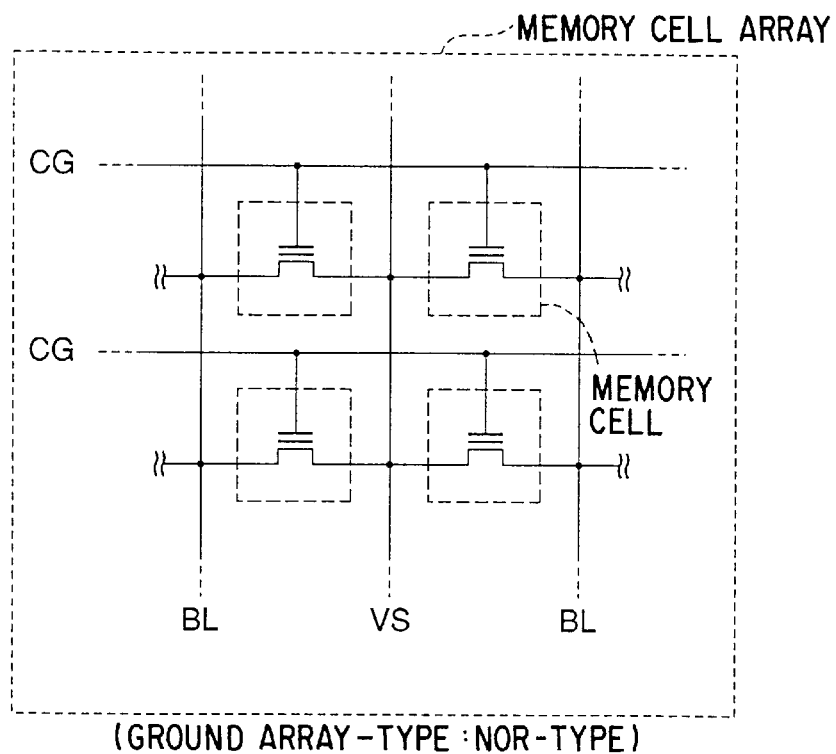
FIG. 20 is a circuit diagram of the memory cell array of a ground array-type EEPROM.
Figure 21:
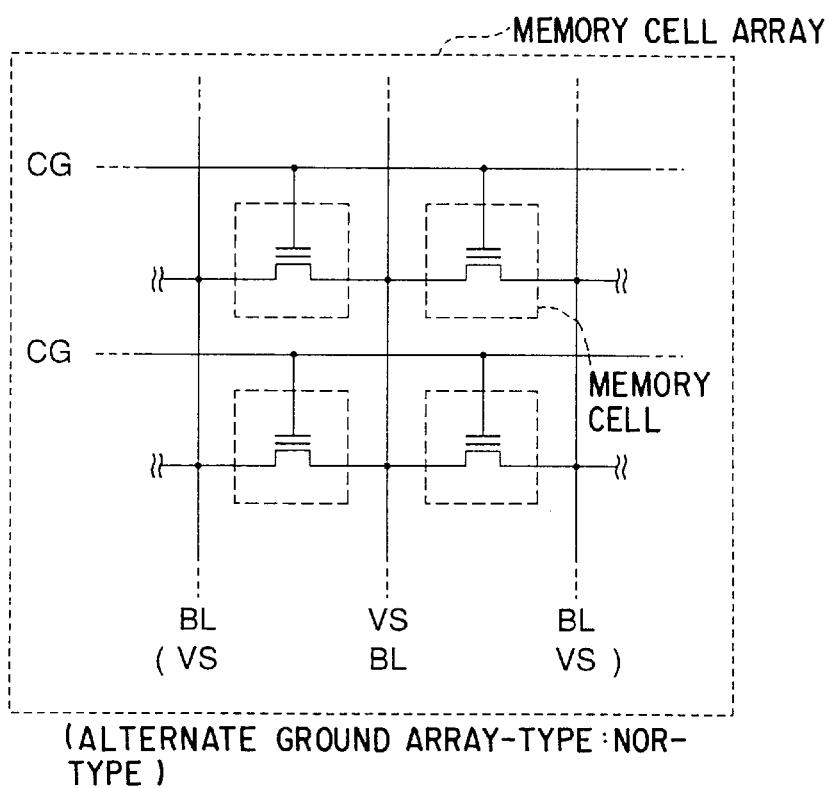
FIG. 21 is a circuit diagram of the memory cell array of an alternate ground array-type EEPROM.

FIGS. 20 and 21 are circuit diagrams of the memory cell arrays of other NOR-type EEPROMs. FIG. 20 is a circuit diagram of a ground array-type EEPROM, and FIG. 21 is a circuit diagram of an alternate ground array-type EEPROM.

The NOR-type EEPROMs shown in FIG. 20 and 21 are called ground array-type EEPROMs. In the ground array-type EEPROM, one memory cell is series-connected between the bit line BL and the source line VS parallel to the bit line BL. The bit line BL and the source VS are respectively fixed in the ground array-type EEPROM shown in FIG. 20, whereas the bit line BL and the source line VS can be alternately switched in the alternate ground array-type EEPROM shown in FIG. 21.

FIG. 22 is a circuit diagram of the memory cell array of a DINOR (DIvided NOR)-type EEPROM.

As shown in FIG. 22, memory cells are parallel-connected between one sub-bit line BL and a plurality of source lines VS. The sub-bit line BL is connected to the bit line BL through the bit-line-side selection gate.

Figure 23:
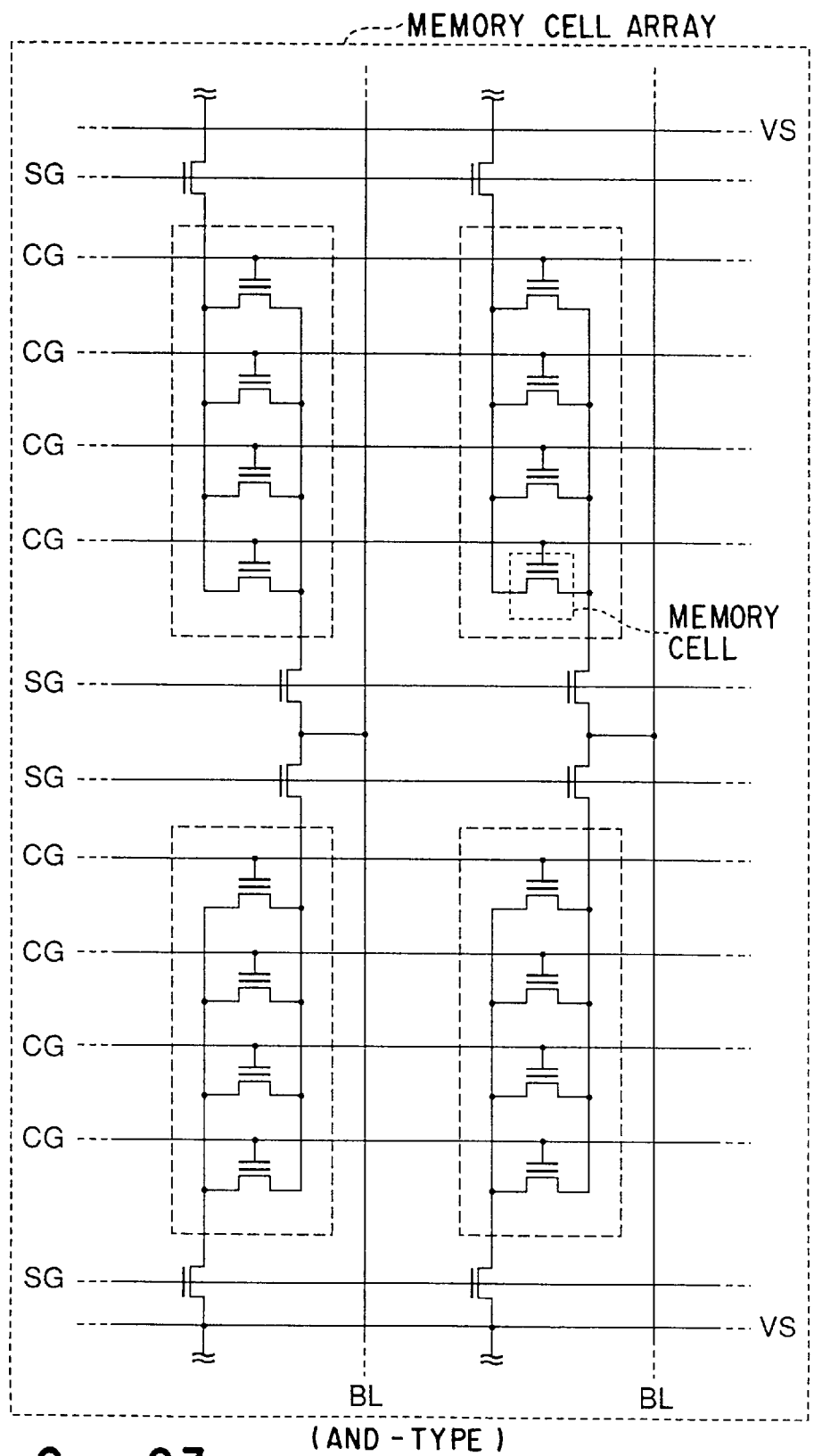
FIG. 23 is a circuit diagram of the memory cell array of an AND-type EEPROM.

FIG. 23 is a circuit diagram of the memory cell array of an AND-type EEPROM.

In the AND-type EEPROM, bit-line-side selection gates, parallel-connected memory cell groups, and source-line-side selection gates are series-connected between the bit lines BL and the source lines VS, as shown in FIG. 23.

In this manner, the memory cell according to the present invention can be applied to not only the NAND-type EEPROM shown in FIG. 17 but also the NOR-type ones (including the ground array-type one) shown in FIGS. 18 to 21, the DINOR-type one shown in FIG. 22, and the AND-type one shown in FIG. 23.

The NOR-type (including the ground array-type), DINOR-type, and AND-type EEPROMs sometimes use substrate hot electrons in a write. Also in a write of the substrate hot electron scheme, since a stronger electric field is generated at the edge portion 222, a higher write speed can be expected or write voltage can be decreased, like in a write of the FN electric current scheme.

A method of manufacturing a NAND-type EEPROM according to the fourth embodiment of the present invention will be described below.

FIG. 24 is a plan view of the memory cell array of a NAND-type EEPROM according to the fourth embodiment of the present invention, and FIGS. 25A to 25L are sectional views taken along the line 25—25 in FIG. 24 to show main manufacturing steps.

As shown in FIG. 25A, the surface of a p-type substrate 1 is oxidized to form a dummy oxide film ($SiO_2$) 21. Silicon nitride ($Si_3N_4$) is deposited on the dummy oxide film 21 to form a silicon nitride film 23. A photoresist is applied on the silicon nitride film 23. The applied photoresist is exposed and developed to form a photoresist pattern 25 which covers element regions where transistors will be formed.

As shown in FIG. 25B, the nitride film 23 and the dummy oxide film 21 are sequentially etched using the photoresist pattern 25 as a mask. The exposed substrate 1 is etched to form trenches 2 in the substrate 1. The photoresist pattern 25 is removed.

As shown in FIG. 25C, the surface of the inner wall of each trench 2 is oxidized. This oxidation is performed to a round edge portion 222 at which the dummy oxide film contacts the side wall of the trench 2. It is preferable that this oxidation utilize a process generally called high-temperature oxidation using an oxidation temperature of, e.g., 1,000° C. or more, and the oxidation atmosphere be a diluted atmosphere. The diluted atmosphere means that the oxygen ($O_2$) concentration is relatively low. With this process, the surface of the inner wall of the trench 2 oxidizes slowly at a high temperature to facilitate rounding of the edge portion 222. In FIG. 25C, reference numeral 31 denotes a silicon oxide film ($SiO_2$) formed by this oxidation.

As shown in FIG. 25D, silicon dioxide ($SiO_2$) is deposited above the substrate 1 to form a silicon oxide film 33. In this step, the trench 2 is filled with the oxide film 33.

As shown in FIG. 25E, the oxide film 33 is polished (or etched back) to planarize its surface. The oxide film 33 is polished until, e.g., the surface of the silicon nitride film 23 is exposed, and shaped to fill the interior of the trench 2. The oxide film 33 shaped to fill the interior of the trench 2 is called an element isolation region 3 in correspondence with FIG. 2B and the like.

As shown in FIG. 25F, the nitride film 23 is removed. The nitride film 23 is removed by isotropic etching. This isotropic etching uses an etchant having a silicon nitride etching rate higher than its silicon dioxide etching rate. Note that the nitride film 23 may be removed by anisotropic etching such as RIE. Then, the dummy oxide film 21 is removed. The dummy oxide film 21 is removed by isotropic etching in order not to destroy the roundness of the edge portion 222 obtained in the step shown in FIG. 24. This isotropic etching uses an etchant having a silicon dioxide etching rate higher than its silicon etching rate. As a result, element regions 4 where the surface of the substrate 1 is exposed, and element isolation regions 3 where the surface of the substrate 1 is covered with the oxide film 33, are completed.

Figure 25G:
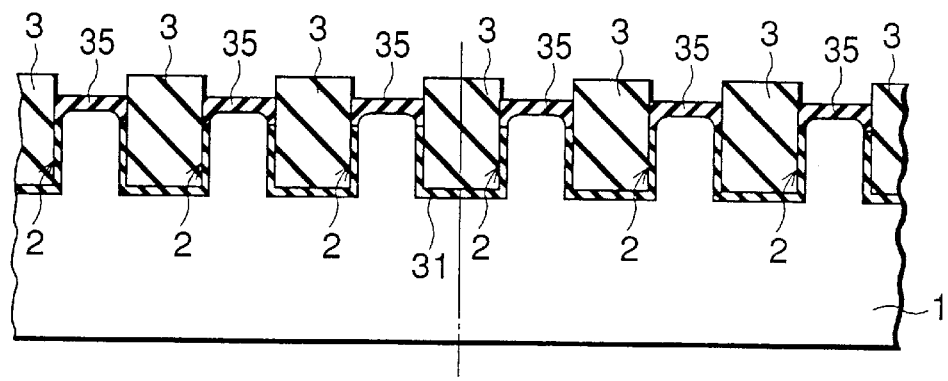

As shown in FIG. 25G, the exposed surface (element region 4) of the substrate 1 is oxidized to form a gate oxide film ($SiO_2$) 35 having an optimal thickness for the gate oxide film of a transistor constituting a selection gate (or a transistor constituting a peripheral circuit; not shown).

Figure 25H:
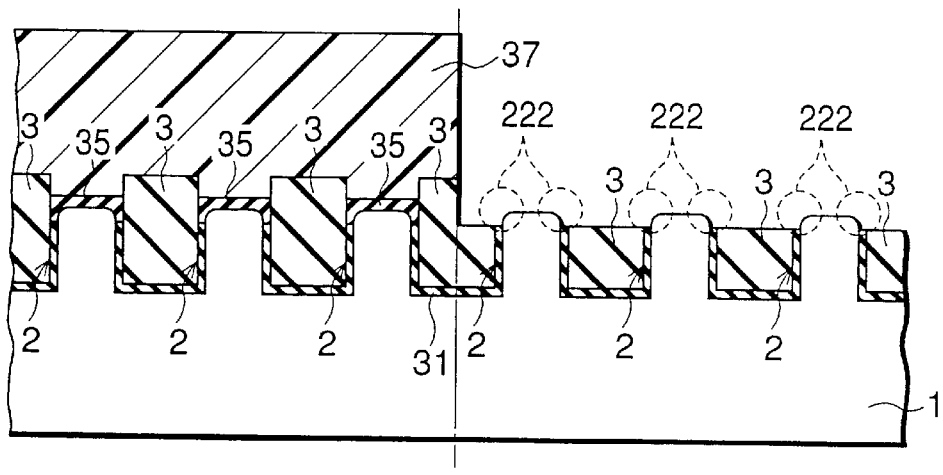

As shown in FIG. 25H, a photoresist is applied above the substrate 1. The applied photoresist is exposed and developed to form a photoresist pattern 37 which covers a region where the selection gate (and the peripheral circuit; not shown) is to be formed. Using the photoresist pattern 37 as a mask, the gate oxide film 35 is removed to expose the surface of the substrate 1 in a region where a memory cell will be formed. The gate oxide film 35 is removed by isotropic etching in order not to destroy the roundness of the edge portion 222 obtained in the step shown in FIG. 25C, similar to the step shown in FIG. 25F. This isotropic etching preferably uses an etchant having a silicon dioxide etching rate higher than its silicon etching rate. Further in this step, the surface portion of silicon dioxide constituting the element isolation region 3 is partially etched to make the surface of the substrate 1 project from the surface of the element isolation region 3. Particularly, the surface of the substrate 1 is made to project to expose the rounded edge portion 222 from the element isolation region 3. Note that the element isolation region 3 is not completely removed, but a portion required to insulate adjacent memory cells is left in the trench 2.

Figure 25I:
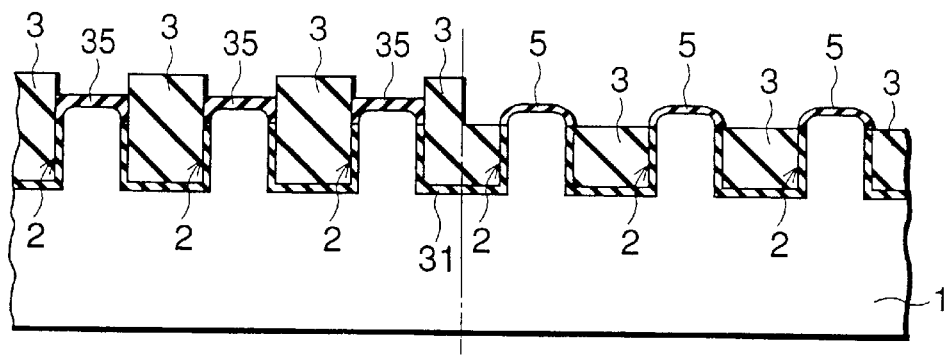

As shown in FIG. 25I, the exposed surface (element region 4) of the substrate 1 is oxidized to form a tunnel oxide film ($SiO_2$) 5 having an optimal thickness for the tunnel oxide film of a transistor constituting a memory cell (or a transistor constituting a peripheral circuit; not shown). The tunnel oxide film 5 serves as an insulating film through which the tunnel electric current passes in writing/erasing data. In this embodiment, for example, the tunnel oxide film 5 is formed along the surface of the substrate 1 to be thinner than the gate oxide film 35, and its thickness is set to a value capable of passing electric charges therethrough. The thickness capable of passing electric charges is not constant, and changes depending on the application manner of the electric field, as is well known.

As shown in FIG. 25J, silicon is deposited above the substrate 1 to form a first polysilicon film 41. An impurity is doped in the polysilicon film 41 to render the silicon conductive. This impurity doping is performed as needed. For example, if silicon is deposited while containing an impurity, no impurity need be doped.

As shown in FIG. 25K, a photoresist is applied on the polysilicon film 41. The applied photoresist is exposed and developed to form a photoresist pattern (not shown). The photoresist pattern (not shown) has openings corresponding to slits for isolating the floating gates of adjacent memory cells along control gates (word lines) later. Using the photoresist pattern (not shown) as a mask, the polysilicon film 41 is etched to form, in the polysilicon film 41, slits 43 for isolating the floating gates of adjacent memory cells along the control gate.

As shown in FIG. 25L, silicon dioxide ($SiO_2$), silicon nitride ($Si_3N_4$), and silicon dioxide ($SiO_2$) are sequentially deposited on the polysilicon film 41 to form a stacked insulating film 7 consisting of silicon dioxide/silicon nitride/silicon dioxide. The stacked insulating film 7 of this type is generally called an ONO film, and the stacked insulating film will be referred to as the ONO film 7 hereinafter. The ONO film 7 will serve as a film for capacitively coupling the control gate and the substrate 1 through the floating gate while insulating the control gate and the floating gate. Silicon is deposited on the ONO film 7 to form a second polysilicon film 47. An impurity is doped in the polysilicon film 47 to render the silicon conductive. This impurity doping is performed as needed. For example, if silicon is deposited while containing an impurity, no impurity need be doped. A photoresist is applied on the polysilicon film 47. The applied photoresist is exposed and developed to form a photoresist pattern (not shown). The photoresist pattern (not shown) has a shape corresponding to control gate and selection gate patterns. Using the photoresist pattern (not shown) as a mask, the second polysilicon film 47, the ONO film 7, and the first polysilicon film 41 are sequentially etched to form bit-line-side (drain-side) selection gates SG1, source-side selection gates SG2, control gates CG1 to CG8 (8), and floating gates FG (6) having a flat pattern like the one shown in FIG. 24. Note that the selection gate of this embodiment has a shape generally called a stacked selection gate. The first and second polysilicon films 41 and 47 constituting the selection gate are electrically connected to each other in a region (not shown), and have the same potential.

A method of manufacturing a NAND-type EEPROM according to the fifth embodiment of the present invention will be described below.

The manufacturing method according to the fifth embodiment is related to another example of the rounding manner of an edge portion 222. Therefore, only steps particularly different from the manufacturing method according to the fourth embodiment will be explained with reference to the several views of the accompanying drawing.

Figure 26B:
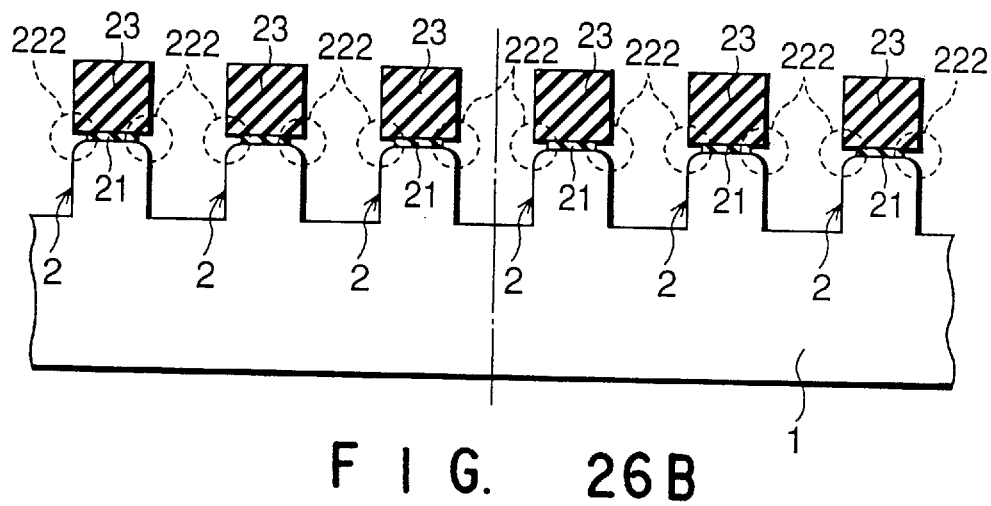
Figure 26C:
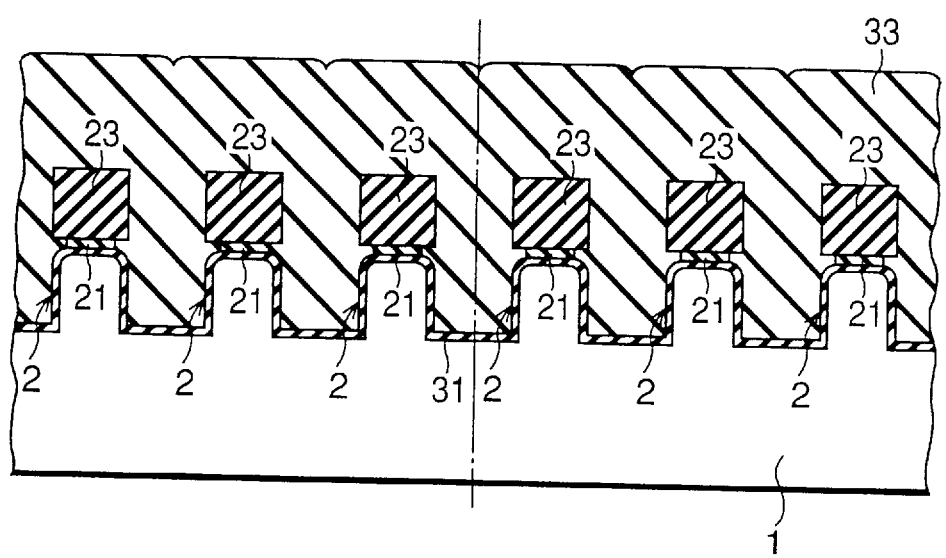

FIGS. 26A to 26C are sectional views, respectively, showing main manufacturing steps. FIGS. 26A to 26C are sectional views taken along the line 25—25 in FIG. 24.

Trenches 2 are formed in a substrate 1 according to the manufacturing method shown in FIGS. 25A and 25B.

As shown in FIG. 26A, a dummy oxide film 21 is etched. This etching is isotopically performed to make the dummy oxide film 21 recede from the side wall of each trench 2. This isotropic etching uses an etchant having a silicon dioxide etching rate higher than its silicon etching rate.

As shown in FIG. 26B, planarization etching is performed for silicon. An edge portion 222 is gradually rounded by this planarization etching. The rounding amount of the edge portion 222, i.e., the size of the radius R can be adjusted by the planarization etching amount. The planarization etching means etching for rounding the corner of silicon, and is, e.g., isotropic etching.

As shown in FIG. 26C, the surface of the inner wall of the trench 2 is oxidized. It is preferable that this oxidation utilize a process generally called high-temperature oxidation using an oxidation temperature of, e.g., 1,000° C. or more, and the oxidation atmosphere be a diluted atmosphere. Silicon dioxide ($SiO_2$) is deposited above the substrate 1 to form a silicon oxide film 33 and fill the trench 2 with the oxide film 33.

According to the manufacturing method shown in FIGS. 25E to 25L, a NAND-type EEPROM having a flat pattern like the one shown in FIG. 24 is formed.

FIG. 27 is an exploded perspective view showing the memory cell according to the embodiments of the present invention.

As shown in FIG. 27, in the memory cell described in the first to fifth embodiments, the element region 4 defined on the surface of the silicon substrate 1 projects from the element isolation region 3. The edge portion 222 along the boundary between the projecting element region 4 and the element isolation region 3 is rounded to have a curved surface so as to concentrate the tunnel electric current as far as no breakdown occurs in the tunnel oxide film 5. To prevent deterioration of the erase characteristics, the flat portion 221 is formed between the edge portions 222 to concatenate the curved surfaces through the flat surface. In this manner, the surface of the element region 4 is constituted by the curved and flat surfaces. The tunnel oxide film 5 is formed along the surface of the element region 4 constituted by the curved and flat surfaces. The floating gate 6 is formed to oppose the surface of the element region 4 constituted by the curved and flat surfaces, via the tunnel oxide film 5. The ONO film 7 and the control gate 8 are sequentially formed to cover the surface of the floating gate 6.

In the memory cell having the above arrangement according to the first to fifth embodiments, the tunnel electric current can be locally flowed through the tunnel oxide film 5 by forming the tunnel oxide film 5 along the surface of the element region 4 constituted by the curved and flat surfaces, and the floating gate 6 to oppose the surface of the element region 4 constituted by the curved and flat surfaces, via the tunnel oxide film 5.

In injecting electrons from the substrate 1 side to the floating gate 6, the tunnel electric current mainly flows through a portion opposing the curved portion of the tunnel oxide film 5, and concentrates at the curved portion. When the write voltage VPP applied across the control gate 8 and the substrate 1 is equal to that in the conventional memory cell shown in FIG. 1, a tunnel current stronger than that in the conventional memory cell flows through the curved portion where the tunnel electric current concentrates. Since the strong tunnel electric current flows, the write speed increases. When the write speed is equal to that in the conventional memory cell, the write voltage can be set lower than that in the conventional memory cell.

In discharging electrons from the floating gate 6 to the substrate 1 side, the tunnel electric current mainly flows through a portion opposing the flat portion of the tunnel oxide film 5. For this reason, if a flat portion is formed in the element region 4 to a certain degree in addition to a curved portion, as described above, deterioration of the erase characteristics can be suppressed.

The memory cell according to the present invention has the following advantages in terms of its structure.

In the conventional memory cell, as shown in FIG. 1, an angle 54 defined by an opposing surface 53 and an edge 52 of the floating gate 106 opposing the control gate 108 is almost a right angle of 90° or an acute angle smaller than 90°. In the cell shown in FIG. 1, the angle 54 is nearly 90° because the edge 52 is formed on the flat surface of the LOCOS oxide film 103. When the edge 52 is formed at a bird's beak 55 of the LOCOS oxide film 103, the angle 54 is an acute angle smaller than 90°. In either case, the electric field concentrates at the edge 52 portion of the floating gate 106 in this structure. For this reason, the electrical breakdown voltage between the floating gate 106 and the control gate 108 weakens.

However, in the memory cell according to the present invention, as shown in, e.g., FIG. 27, the opposing surface 53 of the floating gate 6, that opposes the control gate 8 has roundness 51 reflecting a curved portion 50 of the element region 4. That is, the element region 4 is rounded to project toward the floating gate 6, and the floating gate 6 covers the rounded element region 4. Accordingly, the opposing surface 53 of the floating gate 6 has the roundness 51 reflecting the curved portion 50 of the element region 4. If the edge 52 is formed at the portion of the floating gate 6, that has the roundness 51, the angle 54 defined by the edge 52 and the opposing surface 53 of the floating gate 6 can be adjusted to an obtuse angle larger than 90°. If the angle 54 is an obtuse angle larger than 90°, concentration of the electric field at the edge 52 portion of the floating gate 6 becomes weaker than that when the angle 54 is almost a right angle or an acute angle. Therefore, the electric breakdown voltage between the floating gate 6 and the control gate 8 can be increased, compared to the memory cell shown in FIG. 1. Alternatively, the time up to occurrence of a breakdown between the floating gate 6 and the control gate 8 can be further prolonged.

In the present invention, the above structure can be realized only by sequentially forming the tunnel oxide film 5 and the floating gate 6 on the element region 4 after rounding the element region 4, as shown in FIGS. 25H to 25K. That is, a structure for relaxing concentration of the electric field at the edge 52 portion can be attained without increasing the number of steps upon rounding the element region 4.

As has been described above, according to the present invention, a nonvolatile semiconductor memory device in which the write speed becomes higher than that in the conventional memory cell when the write voltage applied across the control gate and the substrate is equal to that in the conventional memory cell, or the write voltage can be set lower than that in the conventional memory cell when the write speed is equal to that in the conventional memory cell can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A nonvolatile semiconductor memory device comprising:

a semiconductor substrate;

an element isolation region formed in said substrate;

an element region set on a surface of said substrate by the element isolation region to form a memory cell; and a memory cell array prepared by arraying a plurality of electrically data erasable memory cells, each memory cell including a tunnel insulating film formed in the element region, a floating gate formed on said tunnel insulating cell, and a control gate capacitively coupled to the element region through said floating gate and said tunnel insulating film, wherein at least part of the element region convexly projects toward said floating gate, and said convexly projecting portion has a curved portion substantially curvedly opposing said floating gate, and a flat portion substantially flatly opposing said floating gate and said tunnel insulating film covers the curved portion and the flat portion.

2. A device according to claim 1, wherein the element isolation region is a trench-type element isolation region obtained by filling a trench formed in said substrate with an insulator, a portion, opposing an upper surface of the trench-type element isolation region, of a surface of said floating gate opposing said substrate is located deeper than a portion opposing an upper surface of the element region, and the whole element region convexly projects toward said floating gate.

3. A device according to claim 2, wherein the element region further comprises another flat portion along a side wall of the trench.

4. A device according to claim 1, wherein a surface of said floating gate opposing said control gate has roundness reflecting said curved portion of the element region.

5. A device according to claim 1, wherein a minimum value R of a radius of said curved portion is set to satisfy the following relation:

$$\frac{t}{R \ln\left(1 + \frac{t}{R}\right)} < 1.5$$

(t is a thickness of said tunnel insulating film).

6. A device according to claim 1, wherein, when a minimum value of a radius of said curved portion is represented by R, a width W of a portion, opposing said floating gate, of the element region is set to satisfy the following relation:

$$R < \frac{W}{3}$$

(the width W is equal to a width of the same section as a section having the minimum value R).

7. A device according to claim 1, wherein, when a passing direction of electrons passing through said tunnel insulating film is bidirectionally changed by a bias applied in writing/erasing data in/from said memory cell, a maximum value $E_{edge}$ (R) of an electric field generated at said curved portion of the element region in writing data is set to satisfy the following relation:

$$E_{edge}(R) < 1.5 \times E_{flat}(R)$$

($E_{flat}$ (R) is a maximum value of the electric field generated at said flat portion of the element region).

8. A device according to claim 7, wherein an amount $Q_{edge}$ (R) of electric charges passing through said curved portion of the element region per unit time when the electrons pass through said tunnel insulating film from the element region to said floating gate is set to satisfy the following relation:

$$Q_{edge}(R) < 10^5 \times Q_{flat}(R)$$

($Q_{flat}$ (R) is an amount of electric charges passing through said flat portion per unit time).

9. A device according to claim 7, wherein an average electric current density J (R) of an electric current density at a portion opposing said curved portion, and an electric current density at a portion opposing said flat portion when the electrons pass through said tunnel insulating film from said floating gate to the element region is set to satisfy the following relation:

$$J(R) > 0.5 \times J(R=0)$$

(J (R=0) is a total electric current density of said tunnel insulating film in a typical memory cell having an element region with a flat surface, a potential difference between said floating gate and the element region being the same in a memory cell which generates an electric current density J (R), and a memory cell which generates an electric current density J (R=0)).

10. A device according to claim 1, wherein said memory cell is used for one of NAND-type, NOR-type, DINOR-type, and AND-type memories.

11. A nonvolatile semiconductor memory device comprising:

a semiconductor substrate;

an element isolation region formed in said substrate;

an element region set on a surface of said substrate by the element isolation region to form a memory cell; and a memory cell array prepared by arraying a plurality of electrically data erasable memory cells, each memory cell including a tunnel insulating film formed in the element region, a floating gate formed on said tunnel insulating film, and a control gate capacitively coupled to the element region through said floating gate and said tunnel insulating film, wherein at least part of the element region convexly projects toward said floating gate, said convexly projecting portion has a curved portion substantially curvedly opposing said floating gate, and a flat portion substantially flatly opposing said floating gate, said flat portion is a portion having a radius $R \geq W/3$, and said curved portion is a portion having a radius $R \geq W/3$ (W is a width of the element region, and is equal to a width of the same section as a section having the radius R).

12. A device according to claim 11, wherein the element isolation region is a trench-type element isolation region obtained by filling a trench formed in said substrate with an insulator, a portion, opposing an upper surface of the trench-type element isolation region, of a surface of said floating gate opposing said substrate is located deeper than a portion opposing an upper surface of the element region, and the whole element region convexly projects toward said floating gate.

13. A device according to claim 12, wherein the element region further comprises another flat portion along a side wall of the trench.

14. A device according to claim 11, wherein a surface of said floating gate opposing said control gate has roundness reflecting said curved portion of the element region.

15. A device according to claim 11, wherein a minimum value R of a radius of said curved portion is set to satisfy the following relation:

$$\frac{t}{R\mathrm{min}\ln\left(1+\frac{t}{R\mathrm{min}}\right)} < 1.5$$

(t is a thickness of said tunnel insulating film).

16. A device according to claim 11, wherein a minimum value R of a radius of said curved portion is set with in a range of 3 to 100 nm.

17. A device according to claim 11, wherein, when a passing direction of electrons passing through said tunnel insulating film is bidirectionally changed by a bias applied in writing/erasing data in/from said memory cell, a maximum value $E_{edge}$ (R) of an electric field generated at said curved portion of the element region in writing data is set to satisfy the following relation:

$$E_{edge}(R) < 1.5 \times E_{flat}(R)$$

($E_{flat}$ (R) is a maximum value of the electric field generated at said flat portion of the element region).

18. A device according to claim 17, wherein an amount $Q_{edge}$ (R) of electric charges passing through said curved portion of the element region per unit time when the electrons pass through said tunnel insulating film from the element region to said floating gate is set to satisfy the following relation:

$$Q_{edge}(R) < 10^5 \times Q_{flat}(R)$$

($Q_{flat}$ (R) is an amount of electric charges passing through said flat portion per unit time).

19. A device according to claim 17, wherein an average electric current density J (R) of an electric current density at a portion opposing said curved portion, and an electric current density at a portion opposing said flat portion when the electrons pass through said tunnel insulating film from said floating gate to the element region is set to satisfy the following relation:

$$J(R) > 0.5 \times J(R=0)$$

(J (R=0) is a total electric current density of said tunnel insulating film in a typical memory cell having an element region with a flat surface, a potential difference between said floating gate and the element region being the same in a memory cell which generates an electric current density J (R), and a memory cell which generates an electric current density J (R=0)).

20. A device according to claim 11, wherein said memory cell is used for one of NAND-type, NOR-type, DINOR-type, and AND-type memories.

* * * * *